(12) United States Patent
Saito et al.

(10) Patent No.: US 10,186,525 B2
(45) Date of Patent: Jan. 22, 2019

(54) CIRCUIT BOARD, DISPLAY DEVICE, AND PROCESS FOR PRODUCTION OF CIRCUIT BOARD

(71) Applicant: Sharp Kabushiki Kaisha, Sakai, Osaka (JP)

(72) Inventors: Yuichi Saito, Sakai (JP); Yohsuke Kanzaki, Sakai (JP); Yudai Takanishi, Sakai (JP); Tetsuya Okamoto, Sakai (JP); Yoshiki Nakatani, Sakai (JP); Yoshimasa Chikama, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/422,546

(22) Filed: Feb. 2, 2017

(65) Prior Publication Data

US 2017/0194359 A1    Jul. 6, 2017

Related U.S. Application Data

(62) Division of application No. 13/810,113, filed as application No. PCT/JP2011/059198 on Apr. 13, 2011, now abandoned.

(30) Foreign Application Priority Data

Jul. 15, 2010   (JP) .................................. 2010-161077

(51) Int. Cl.
   *H01L 21/44*   (2006.01)
   *H01L 27/12*   (2006.01)
   (Continued)

(52) U.S. Cl.
   CPC .... *H01L 27/1225* (2013.01); *H01L 21/02565* (2013.01); *H01L 21/32134* (2013.01);
   (Continued)

(58) Field of Classification Search
   CPC . H01L 27/1225; H01L 27/124; H01L 27/127; H01L 21/02565; H01L 21/465;
   (Continued)

(56) References Cited

U.S. PATENT DOCUMENTS

2006/0043447 A1*  3/2006  Ishii .................. H01L 29/41733
                                                     257/295
2006/0292888 A1*  12/2006  Park ....................... C09K 13/08
                                                     438/754

(Continued)

OTHER PUBLICATIONS

Saito et al., "Circuit Board, Display Device, and Process for Production of Circuit Board", U.S. Appl. No. 13/810,113, filed Jan. 24, 2013.

*Primary Examiner* — Allen Parker
*Assistant Examiner* — Patricia Reddington
(74) *Attorney, Agent, or Firm* — Keating & Bennett, LLP

(57) ABSTRACT

The present invention provides a circuit board having excellent productivity, particularly a circuit board having excellent productivity with respect to a semiconductor layer and source layer forming step, a display device, and a process for producing a circuit board. The circuit board of the present invention is a circuit board including an oxide semiconductor layer and an electrode connected to the oxide semiconductor layer, wherein the electrode is formed by essentially laminating a layer made of a metal other than copper and a layer containing copper.

11 Claims, 31 Drawing Sheets

(51) Int. Cl.
*H01L 21/3213* (2006.01)
*H01L 23/532* (2006.01)
*H01L 29/66* (2006.01)
*H01L 29/786* (2006.01)
*H01L 21/465* (2006.01)
*H01L 21/4763* (2006.01)
*H01L 29/24* (2006.01)
*H01L 29/45* (2006.01)
*H01L 21/02* (2006.01)
*G02F 1/1343* (2006.01)
*G02F 1/1362* (2006.01)
*G02F 1/1333* (2006.01)
*G02F 1/1368* (2006.01)

(52) U.S. Cl.
CPC ...... *H01L 21/465* (2013.01); *H01L 21/47635* (2013.01); *H01L 23/53233* (2013.01); *H01L 23/53238* (2013.01); *H01L 27/124* (2013.01); *H01L 27/127* (2013.01); *H01L 27/1222* (2013.01); *H01L 27/1288* (2013.01); *H01L 29/24* (2013.01); *H01L 29/45* (2013.01); *H01L 29/66969* (2013.01); *H01L 29/7869* (2013.01); *G02F 1/1368* (2013.01); *G02F 1/13439* (2013.01); *G02F 1/133345* (2013.01); *G02F 1/134336* (2013.01); *G02F 1/136286* (2013.01); *G02F 2001/133302* (2013.01); *G02F 2001/136231* (2013.01); *G02F 2001/136236* (2013.01); *G02F 2001/136295* (2013.01); *H01L 21/02554* (2013.01); *H01L 21/02631* (2013.01); *H01L 21/44* (2013.01); *H01L 2924/0002* (2013.01)

(58) Field of Classification Search
CPC ... H01L 21/47635; H01L 29/24; H01L 29/45; H01L 29/66969; H01L 29/7869; H01L 21/02361; H01L 21/44; H01L 21/02554
USPC ............................................................. 257/43
See application file for complete search history.

(56) References Cited

U.S. PATENT DOCUMENTS

| | | | |
|---|---|---|---|
| 2009/0180045 A1* | 7/2009 | Yoon | G02F 1/1368 349/43 |
| 2010/0035378 A1* | 2/2010 | Chang | H01L 29/7869 438/104 |
| 2010/0105164 A1* | 4/2010 | Ito | H01L 27/1214 438/104 |

* cited by examiner

CIRCUIT BOARD, DISPLAY DEVICE, AND PROCESS FOR PRODUCTION OF CIRCUIT BOARD

TECHNICAL FIELD

The present invention relates to a circuit board, a display device, and a process for producing a circuit board, and more specifically, relates to an active matrix substrate using a thin film transistor (hereinafter, referred to as a "TFT"), a display device, and a process for producing a circuit board.

BACKGROUND ART

Circuit boards generally have an electronic circuit including wiring lines, electrodes, switching elements and the like on a board, and are used as basic components of electronic devices such as display devices. An active matrix substrate which is a sort of circuit boards includes a plurality of wiring lines, a plurality of pixels, TFTs which are switching elements corresponding to pixels, and the like. The active matrix substrate is widely used in the production of, for example, liquid crystal display devices and EL (Electroluminescence) display devices which are used in a cellular phone, a PDA (personal digital assistant), a television receiver, and the like.

Hitherto, as a TFT included in the active matrix substrate, TFTs in which an amorphous silicon layer made of amorphous silicon are used as an active layer (hereinafter, referred to as an "amorphous silicon TFTs") have been widely used.

In recent years, as new semiconductor alternatives to amorphous silicon, metal oxide semiconductors such as a Zn—O based semiconductor (ZnO semiconductor) and an In—Ga—Zn—O based semiconductor (IGZO semiconductor) have been considered, and TFTs (oxide semiconductor TFTs) in which an oxide semiconductor layer made of these metal oxide semiconductors is used as an active layer have been proposed. Non Patent Literature 1 discloses an oxide semiconductor TFT having characteristics in which the mobility (saturation mobility) is approximately 5.6 $cm^2/Vs$ to 8.0 $cm^2/Vs$ and the threshold value is approximately −6.6 V to −9.9 V. On the other hand, the mobility of a general amorphous silicon TFT is ordinarily 1 $cm^2/Vs$ or less.

As seen from the above, since the mobility of an oxide semiconductor TFT is higher than the mobility of an amorphous silicon TFT, the use of an oxide semiconductor TFT has a merit of enabling the creation of a more multi-functional circuit board. For example, in the active matrix substrate in which the oxide semiconductor TFT is used, even when a gate driver (scan signal line driver) is formed integrally (monolithically) on a circuit board, such a large occupation area as in an active matrix substrate in which the amorphous silicon TFT is used is not required.

Amorphous silicon TFTs in the related art can be created by using, for example, a four-mask process disclosed in Patent Literature 1. In this four-mask process, halftone exposure technology is used, a resist pattern film having two kinds of film thickness is formed on a source metal layer for forming a source electrode, a drain electrode, a data signal line and the like, and the source metal layer and a semiconductor layer located thereunder are processed using substantially the same resist pattern film.

CITATION LIST

Patent Literature

Patent Literature 1: Japanese Unexamined Patent Application Publication No. 2009-4787

Non Patent Literature

Non Patent Literature 1: Je-hun Lee et al., "World's Largest (15-inch) XGA AMLCD Panel Using IGZO Oxide TFT", SID 08 DIGEST, (USA), Society for Information Display, 2008, Volume 39, Issue 1, p. 625-628

SUMMARY OF INVENTION

Technical Problem

In Patent Literatures mentioned above, no reference is made to the production of a circuit board, having excellent productivity, by suitably applying wet etching at the time of forming semiconductor layers, wiring lines and electrodes.

As a process for producing an active matrix substrate using an amorphous silicon TFT in the related art, there is a process in which a different mask (resist pattern film) is used in, for example, a five-mask process, that is, each of five steps of a gate layer forming step, a semiconductor layer forming step, a source layer forming step, an interlayer insulating layer forming step, and a pixel electrode layer forming step. In this process, the semiconductor layer forming step and the source layer forming step are performed by using different masks, but an investment in equipment such as an exposure apparatus for forming a resist pattern film increases, and thus there is room for consideration of further improvement in productivity. As a process for producing an active matrix substrate in order to further improve productivity, there is a four-mask process capable of performing the semiconductor layer forming step and the source layer forming step by using one mask by providing a resist pattern film in a step-by-step manner by using a photomask having three transmittances of transmission, non-transmission, and intermediate transmission. Meanwhile, in the present specification, the semiconductor layer forming step and the source layer forming step which are performed by using one mask are called a semiconductor layer and source layer forming step. However, even in this four-mask process, when a semiconductor layer and a contact layer are formed of an amorphous silicon film and an $n^+$ amorphous silicon film, respectively, which have a high chemical resistance, it is difficult to perform wet etching on the amorphous silicon film and the $n^+$ amorphous silicon film without damage to a source metal layer for forming a source layer, a formed data signal line or the like, and thus dry etching is generally used in etching the amorphous silicon film and the $n^+$ amorphous silicon film.

Therefore, even when wet etching is used in etching the source metal layer, it is necessary to use dry etching having a throughput lower than that of wet etching, in etching the amorphous silicon film and the $n^+$ amorphous silicon film, and thus an equipment investment increases. As seen from the above, in a circuit board in the related art and a process for producing the same, there is room for consideration of an improvement in the productivity of a throughput, an equipment investment and the like.

A more detailed description is as follows. When the active matrix substrate is produced by using the four-mask process in the related art, in the semiconductor layer and source layer forming step, operations are performed in order of formation of a semiconductor layer→formation of an electric conductor layer (source metal layer) for forming a source layer-→formation of a resist pattern film (thick resist pattern film and thin resist pattern film) having a two-step film thickness formed by a photolithographic method→the first etching step→the second etching step→removal of the resist pattern film (arrows indicate transition to the next operation).

Here, in the first etching step, processing in portions other than a gap portion of the TFT is mainly performed, and the etching of the source metal layer, the $n^+$ amorphous silicon film and the amorphous silicon film are sequentially performed. In the second etching step, processing in the gap portion of the TFT (area equivalent to between source and drain electrodes of the TFT) is mainly performed, and dry etching removal of a thin resist pattern film in the gap portion of the TFT→etching of the source metal layer in the gap portion of the TFT→etching of the $n^+$ amorphous silicon film in the gap portion of the TFT (arrows indicate transition to the next operation) are performed.

That is, a step of dry-etching the amorphous silicon film and/or the $n^+$ amorphous silicon film is included in both the first etching step and the second etching step. In such a process, since the number of dry etching steps cannot be reduced, similarly to the five-mask process in the related art, it is difficult to further reduce an equipment investment.

Meanwhile, in the five-mask process in the related art, the step of dry-etching the amorphous silicon film and/or the $n^+$ amorphous silicon film is also included in both the semiconductor layer forming step and the source layer forming step. In such a process, since the number of dry etching steps cannot be reduced, it is difficult to further reduce an equipment investment associated with etching.

The present invention is contrived in view of such circumstances, and an object thereof is to provide a circuit board having excellent productivity, particularly, a circuit board having excellent productivity with respect to a semiconductor layer and source layer forming step and an excellent production yield rate, a display device, and a process for producing a circuit board.

Solution to Problem

The inventors have focused on a step of forming a semiconductor layer and an electrode connected thereto which are constructional members of a circuit board, as a result of various examinations of a circuit board having excellent productivity, a display device, and a process for producing a circuit board. The inventors have contrived a solution that solves the above-mentioned problems, by finding that in the circuit board in the related art, wet etching cannot be performed with good controllability on a semiconductor layer without damage to a source metal layer and constructional members (for example, a source electrode, a drain electrode, a data signal line and the like) formed of the source metal layer, and by finding that in the circuit board including an oxide semiconductor layer and an electrode connected thereto, the above-mentioned electrode is formed by essentially laminating a layer made of a metal other than copper and a layer containing copper, thereby allowing the selectivity, in wet etching, of the oxide semiconductor layer to the source metal layer and the constructional members formed of the source metal layer to be sufficiently adjusted, and allowing productivity to be sufficiently improved, and thus have reached the present invention.

That is, the present invention is a circuit board including: an oxide semiconductor layer; and an electrode which is connected to the oxide semiconductor layer, wherein the electrode is formed by essentially laminating a layer made of a metal other than copper (Cu) and a layer containing copper. Here, the metal other than copper is, for example, a metal containing molybdenum (Mo) and titanium (Ti).

The above-mentioned electrode is formed by essentially laminating a layer made of a metal other than copper and a layer containing copper, using an oxide semiconductor layer (particularly, IGZO semiconductor layer) as a semiconductor layer, and thus in the semiconductor layer and source layer forming step, for example, in the four-mask process, it is possible to sufficiently adjust the selectivity, in wet etching, of the oxide semiconductor layer to the upper layer and/or the lower layer of the electrode, and to perform wet etching with good controllability on the source metal layer, a primary processing layer of the source metal layer and the semiconductor layer. As a result, it is possible to efficiently obtain a circuit board, and to improve a production yield rate. In addition, wet etching is performed in the circuit board having the above-mentioned configuration, and thus in the semiconductor layer and source layer forming step in four masks (for example, TFT using IGZO, source: Cu/Mo laminated film or Cu/Ti laminated film, and the like) of the present invention, it is possible to reduce the number of steps of dry-etching a semiconductor layer in the first etching step and the second etching step, two times, as compared with the four-mask process in the related art using amorphous silicon as the above-mentioned semiconductor layer, and to further reduce an equipment investment.

The above-mentioned electrode may be formed by essentially laminating a layer made of a metal other than copper and a layer containing copper, and can be formed by appropriately laminating other electric conductor layers before the layer made of a metal other than copper, between the layer made of a metal other than copper and the layer containing copper, and after the layer containing copper. However, the lowermost layer of the electrode is preferably formed of a layer made of a metal other than copper. In addition, it is preferable that the above-mentioned electrode be formed by laminating substantially only a layer made of a metal other than copper and a layer containing copper. Meanwhile, in the connection of the above-mentioned electrode to the oxide semiconductor layer, the electrode and the oxide semiconductor layer may be connected to each other to such an extent that electrical conduction is possible, the above-mentioned electrode may come into contact with the surface of the oxide semiconductor layer as a specific shape, the above-mentioned electrode may come into contact with the pattern edge of the oxide semiconductor layer, and the above-mentioned electrode may come into contact with the oxide semiconductor layer through a thin-film insulating layer. The same is true of the following description.

The thickness ratio of the layer made of a metal other than copper to the layer containing copper is preferably 1:3 to 1:100. More preferably, the ratio is 1:10 to 1:100. In such a case, since the tapered shape of the end edge of the electrode is improved, it is possible to improve particularly the production yield rate. In addition, for a similar reason, the thickness of the layer made of a metal other than copper is preferably 3 nm to 50 nm.

The type of the source and gate electrode and the type of the etchant which are suitable for the present invention will be described below in detail.

A preferred form of the circuit board of the present invention includes a form in which the layer made of a metal other than copper contains at least one selected from a group consisting of titanium and molybdenum. For example, titanium, a titanium alloy, molybdenum, a molybdenum alloy, a lamination thereof, or the like can be appropriately used. A more preferred form includes a form in which the layer made of a metal other than copper is made of at least one selected from a group consisting of titanium and molybdenum. In addition, the layer containing copper is preferably a form made of copper.

The oxide semiconductor layer is normally a composite metal oxide semiconductor layer, and preferably includes indium gallium zinc composite oxide (hereinafter, referred to IGZO) containing indium oxide ($In_2O_3$), gallium oxide ($Ga_2O_3$), and zinc oxide (ZnO). A more preferred aspect of the circuit board of the present invention includes a form in which the oxide semiconductor layer is made of indium gallium zinc composite oxide. Further, another aspect of the circuit board of the present invention includes a form in which the oxide semiconductor layer is made of indium gallium zinc composite oxide having a plurality of different compositions, and the present invention can be implemented similarly.

A preferred form of the circuit board of the present invention includes a form in which the electrode includes a source electrode and a drain electrode, the source electrode and the drain electrode include portions connected to the oxide semiconductor layer, respectively, and the portion of the source electrode which is connected to the semiconductor layer and the portion of the drain electrode which is connected to the semiconductor layer face each other with a gap interposed therebetween. The present invention can be suitably applied to the circuit board having the above-mentioned form which is generally widely used as a TFT.

The portion of the source electrode which is connected to the semiconductor layer and the portion of the drain electrode which is connected to the semiconductor layer are preferably located further inside than the semiconductor layer when a main surface of the board is seen in a plan view. As mentioned in the steps of producing a circuit board, the above-mentioned form can be configured by enhancing the controllability of wet etching. In other words, the semiconductor layer is preferably larger in width than any of the source electrode and the drain electrode. More preferably, the semiconductor layer is larger in width than any of the data signal line, the source electrode, the drain electrode, and the drain lead-out line.

The present invention also relates to a display device including the circuit board of the present invention. Thereby, it is possible to exhibit the same effect as that of the above-mentioned circuit board. A preferred form of the circuit board included in the display device is the same as the preferred form of the circuit board mentioned above.

The present invention also relates to a process for producing a circuit board including an oxide semiconductor layer and an electrode connected to the oxide semiconductor layer, the process including: a semiconductor layer forming step of forming an oxide semiconductor layer; an electric conductor layer forming step of forming an electric conductor layer by essentially laminating a layer made of a metal other than copper and a layer containing copper; and a processing step of processing the electric conductor layer by using wet etching, wherein the processing step includes forming the electrode. Thereby, similarly to the above-mentioned circuit board of the present invention, it is possible to improve productivity. A preferred form of the process for producing a circuit board of the present invention is the same as the preferred form of the circuit board of the present invention. Meanwhile, in the essential lamination of the layer made of a metal other than copper and the layer containing copper, the oxide semiconductor layer may be formed, and the electric conductor layer may be formed by essentially laminating the layer made of a metal other than copper and the layer containing copper. Other electric conductor layers can be appropriately laminated before the layer made of a metal other than copper, between the layer made of a metal other than copper and the layer containing copper, and after the layer containing copper. However, the lowermost layer of the electrode is preferably comprised of a layer made of a metal other than copper. In addition, it is particularly preferable to laminate substantially only a layer made of a metal other than copper and a layer containing copper.

Preferred forms of the process for producing a circuit board of the present invention include, for example, the following forms of (1) and (2). (1) A form in which the processing step includes a first etching step of etching the electric conductor layer and the oxide semiconductor layer and a second etching step of etching the electric conductor layer by using wet etching, and the second etching step separates the electric conductor layer into a source electrode and a drain electrode, and causes a portion of the source electrode which is connected to the semiconductor layer and a portion of the drain electrode which is connected to the semiconductor layer to face each other with a gap interposed therebetween, and (2) A form in which the processing step includes a gap portion etching step of etching the electric conductor layer by using wet etching, and the gap portion etching step separates the electric conductor layer into a source electrode and a drain electrode, and causes a portion of the source electrode which is connected to the semiconductor layer and a portion of the drain electrode which is connected to the semiconductor layer to face each other with a gap interposed therebetween.

First, the above-mentioned form of (1) which is one of preferred forms of the process for producing a circuit board of the present invention will be described. The above-mentioned form of (1) is particularly suitable for application to a four-mask process for performing a semiconductor layer forming step and a source layer forming step by using one mask.

In the second etching step, insofar as a function as the circuit board of the present invention is not damaged, the oxide semiconductor layer may be partially removed.

In the first etching step and/or the second etching step, the layer containing copper is preferably etched by using an etchant containing hydrogen peroxide and an acid. For example, in the second etching step, the etchant containing hydrogen peroxide and an acid is preferably used.

In addition, it is preferable that the layer made of a metal other than copper is a layer made of a metal containing molybdenum, and in the first etching step and/or the second etching step, the layer made of a metal containing molybdenum is etched by using an etchant containing hydrogen peroxide and an acid.

In addition, in the first etching step and/or the second etching step, the layer containing copper is preferably etched by using an alkaline etchant. For example, in the second etching step, the alkaline etchant is preferably used. Further, it is preferable that the layer made of a metal other than copper is a layer made of a metal containing titanium, and in the first etching step and/or the second etching step, the layer made of a metal containing titanium is etched by using an alkaline etchant.

In addition, in the process for producing a circuit board of the present invention, the alkaline etchant includes an etchant, specifically, containing ammonia and hydrogen peroxide. For example, the alkaline etchant is preferably an etchant containing hydrogen peroxide and ammonia. Meanwhile, for example, the alkaline etchant used in etching copper is also called a copper alkaline etchant.

In addition, in the first etching step, the oxide semiconductor layer is preferably etched by using an etchant containing oxalic acid.

Further, the alkaline etchant is preferably an etchant containing hydrogen peroxide, ammonia and an acid. In such a case, the layer containing copper and the layer made of a metal containing titanium are preferably etched at one time.

Next, the above-mentioned form of (2) which is one more preferred form of the process for producing a circuit board of the present invention will be described. The above-mentioned form of (2) is particularly suitable for application to a five-mask process for performing a semiconductor layer forming step and a source layer forming step by using a separate mask.

It is preferable that the processing step in the process for producing a circuit board of the present invention includes a gap portion etching step of etching the electric conductor layer by using wet etching, and the gap portion etching step separates the electric conductor layer into a source electrode and a drain electrode, and causes a portion of the source electrode which is connected to the semiconductor layer and a portion of the drain electrode which is connected to the semiconductor layer to face each other with a gap interposed therebetween.

In the gap portion etching step, the layer containing copper is preferably etched by using an etchant containing hydrogen peroxide and an acid.

It is preferable that the layer made of a metal other than copper is a layer made of a molybdenum-based metal, and in the gap portion etching step, the layer made of a molybdenum-based metal is etched by using an etchant containing hydrogen peroxide and an acid.

In the gap portion etching step, the layer containing copper is preferably etched by using an alkaline etchant.

It is preferable that the layer made of a metal other than copper is a layer made of a titanium-based metal, and in the gap portion etching step, the layer made of a titanium-based metal is etched by using an alkaline etchant. The above-mentioned alkaline etchant is preferably an etchant containing hydrogen peroxide and ammonia.

Further, in the gap portion etching step, the alkaline etchant is preferably an etchant containing hydrogen peroxide, ammonia and an acid. In such a case, the layer containing copper and the layer made of a metal containing titanium are preferably etched at one time.

In addition, in the semiconductor layer forming step, the oxide semiconductor layer is preferably etched by using an etchant containing oxalic acid.

From the viewpoint that etching damage to the semiconductor layer made of IGZO can be reduced and a pattern defect can be sufficiently prevented from occurring, such an etchant is particularly suited for an etchant in creating an oxide semiconductor TFT, and can make productivity sufficiently improve.

The circuit board of the present invention includes the above-mentioned oxide semiconductor layer and the electrode connected thereto, and normally includes other components constituting the circuit board in addition to the above-mentioned preferred components and such essential components that the electrode is formed by essentially laminating a layer made of a metal other than copper and a layer containing copper. The same is true of the display device of the present invention and the process for producing a circuit board. Such other components are not particularly limited.

The aforementioned modes may be employed in appropriate combination as long as the combination is not beyond the spirit of the present invention.

Advantageous Effects of Invention

According to a circuit board, a display device, and a process for producing a circuit board of the present invention, it is possible to sufficiently improve productivity in the circuit board and the display device including the circuit board.

DESCRIPTION OF EMBODIMENTS

Figure 1:
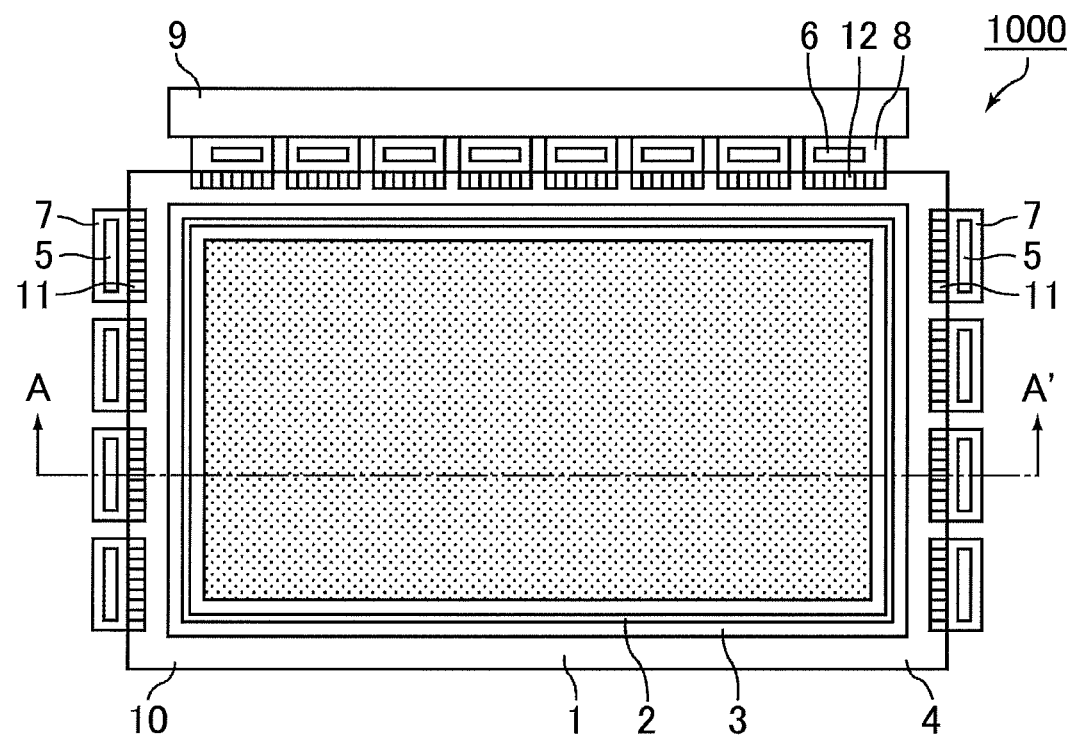
FIG. 1 is a plan view schematically illustrating a liquid crystal display device according to Embodiment 1 of the invention.

The present invention will be mentioned in more detail referring to the drawings in the following embodiments, but is not limited to these embodiments. The present invention can be applied not only to a liquid crystal display device according to an embodiment, but also an EL display device such as, for example, an organic EL display device, an inorganic EL display device, and the like. For the convenience of description, hereinafter, the stretching direction of a scan signal line is set to a row direction, and the stretching direction of a data signal line is set to a column direction. However, in a state of use (viewing) of the liquid crystal display device including a liquid crystal panel (or an active matrix substrate used therefor) of the present embodiment, it goes without saying that the scan signal line may stretch in the traverse direction and may stretch in the longitudinal direction. Meanwhile, in the drawing showing a liquid crystal panel, an alignment regulating structure is appropriately omitted. In addition, in the present specification, the phrase "corresponding to a pixel" means a member used when the pixel is driven.

Embodiment 1

Configuration Example of Liquid Crystal Display Device

FIG. 1 is a plan view schematically illustrating a liquid crystal display device 1000 according to Embodiment 1 of the invention. The liquid crystal display device 1000 mainly includes a liquid crystal panel 4 constituted by an active matrix substrate 1 which is a sort of circuit board and a counter substrate (color filter substrate) 3 bonded to the active matrix substrate 1 by using a sealing material 2, gate drivers 5, source drivers 6, polyimide films 7 and 8, and an external substrate 9.

The gate drivers 5 and the source drivers 6 receive power and signals required for driving from the external substrate 9 through wiring line (not shown) provided in the polyimide films 7 and 8 or the active matrix substrate 1, terminals in gate terminal portions 11 and source terminal portions 12, or the like, and perform predetermined outputs to the liquid crystal panel 4.

Figure 2:
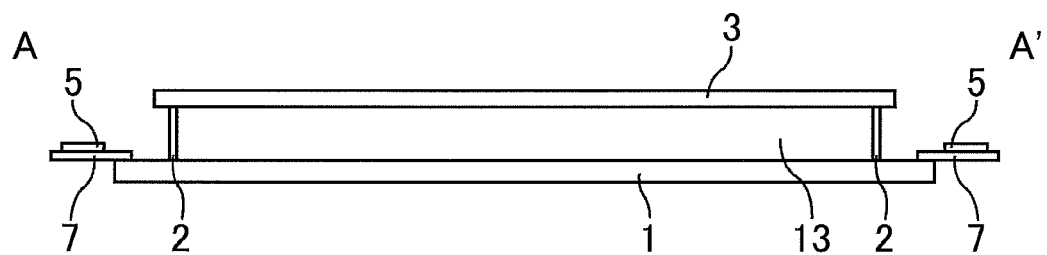
FIG. 2 is a cross-sectional view taken along line A-A' of FIG. 1.

FIG. 2 is a cross-sectional view taken along line A-A' of FIG. 1, and a liquid crystal material 13 is held between the active matrix substrate 1 and the counter substrate 3. In the present embodiment, a color filter layer, a black matrix layer, and a counter electrode are provided on the surface of the counter substrate 3 facing the liquid crystal material 13, but a description thereof will be omitted herein. Moreover, in addition thereto, the liquid crystal display device includes an optical film such as a polarizing film, a backlight unit, other optical components, circuit components, bezels for holding these components at predetermined positions, and the like, but a description thereof will also be omitted in FIGS. 1 and 2.

Meanwhile, in FIGS. 1 and 2, although the gate drivers 5 are provided in a queue on both ends (right and left ends in the drawing) of the liquid crystal display device 1000, the present invention is not limited thereto, but may be provided, for example, on only one end (left end or right end) of the liquid crystal display device 1000. Similarly, in FIGS. 1 and 2, the source drivers 6 are provided in a queue on one end (top end in the drawing) of the liquid crystal display device 1000, but may be provided, for example, on the top and bottom ends (top and bottom ends in the drawing) of the liquid crystal display device 1000.

Configuration Example of Active Matrix Substrate

Figure 3:
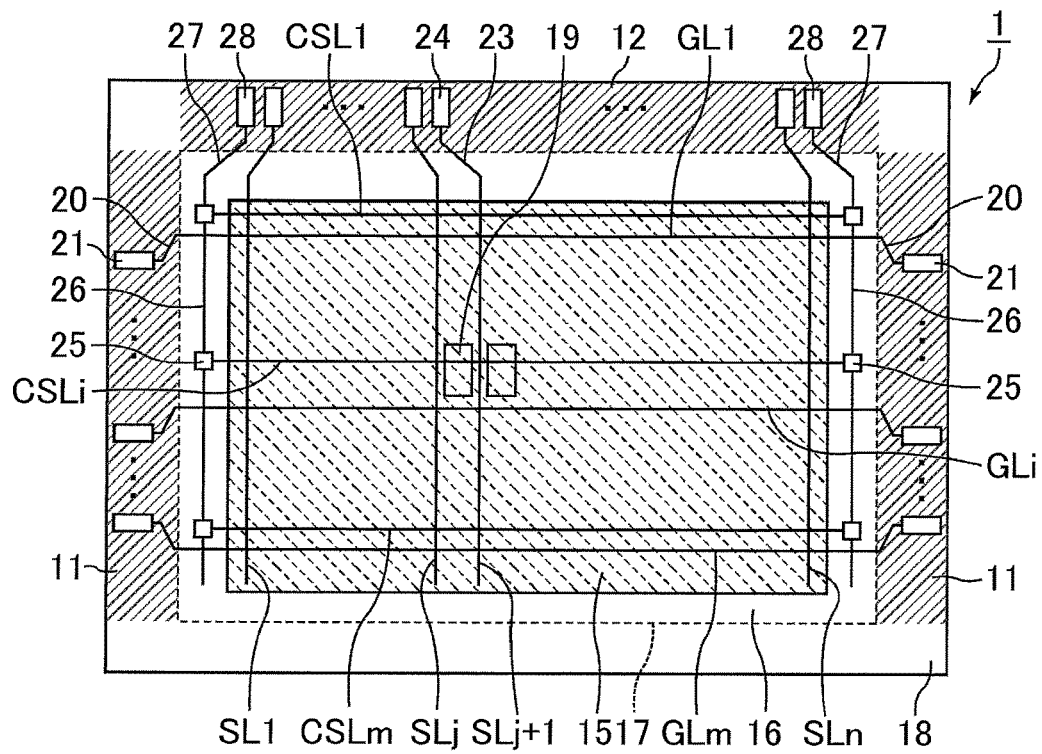
FIG. 3 is a plan view illustrating an active matrix substrate 1 of Embodiments 1 and 2.

FIG. 3 shows a plan view illustrating the active matrix substrate 1 of Embodiments 1 and 2.

A region on the active matrix substrate 1 of the present invention can be divided into a display region 15 having a plurality of pixels and a peripheral region 16 located therearound. In FIG. 3, the display region 15 is a region indicated by the diagonal line (broken line). The peripheral region 16 is a region located on the outside thereof. Meanwhile, in order to create a liquid crystal panel, the sealing material is disposed in a sealing line 17, indicated by the broken line, of the region located on the outside thereof so as to surround the display region 15 from the outside.

The active matrix substrate 1 has pixel and various types of wiring lines on a glass substrate 18, has m scan signal lines GL1 to GLm, m holding capacitance wiring lines CSL1 to CSLm, and n data signal lines SL1 to SLn, and has m×n pixels corresponding thereto (m and n are natural numbers).

The pixel 19 of FIG. 3 is a pixel corresponding to the i-th scan signal line GLi, the i-th holding capacitance wiring line CSLi, and the j-th data signal line SLj.

Each of the scan signal lines GL1 to GLm is connected to a gate terminal 21 through a gate lead-out line 20 made of a metal layer located on the same layer as the scan signal lines GL1 to GLm. Here, a large number of gate terminals 21 are provided in a gate terminal portion 11.

Each of the data signal lines SL1 to SLn is connected to a source terminal 24 through a source lead-out line 23 made of a metal layer located on the same layer as the data signal lines SL1 to SLn. Here, a large number of source terminals 24 are provided in a source terminal portion 12.

Each of the holding capacitance wiring lines CSL1 to CSLm is connected to a holding capacitance wiring trunk 26 made of a metal layer located on the same layer as the data signal lines SL1 to SLn through a contact 25, and the holding capacitance wiring trunk 26 is connected to a holding capacitance wiring line terminal 28 through a holding capacitance wiring trunk lead-out line 27 made of a metal layer located on the same layer as the data signal lines SL1 to SLn. Here, a small number of holding capacitance wiring line terminals 28 are provided in a portion of the source terminal portion 12, and a signal supplied from the external substrate 9 is received through the terminals and wiring lines provided in a polyimide film 8 shown in FIG. 1.

In FIGS. 4 to 11, the active matrix substrate 1 of the present invention will be described in detail.

Here, the pixel 19 corresponds to the i-th scan signal line 46 (GLi) and the j-th data signal line 45 (SLj), is provided in the vicinity of an intersection point thereof, and is disposed so that the i-th holding capacitance wiring line 47 (CSLi) traverses the pixel 19. Here, i and j are arbitrary natural numbers equal to or less than m and n, respectively. The pixel 19 is a region for performing a display by changing the transmittance of backlight light by using the liquid crystal material 13, for example, in a transmissive liquid crystal display device.

Figure 4:
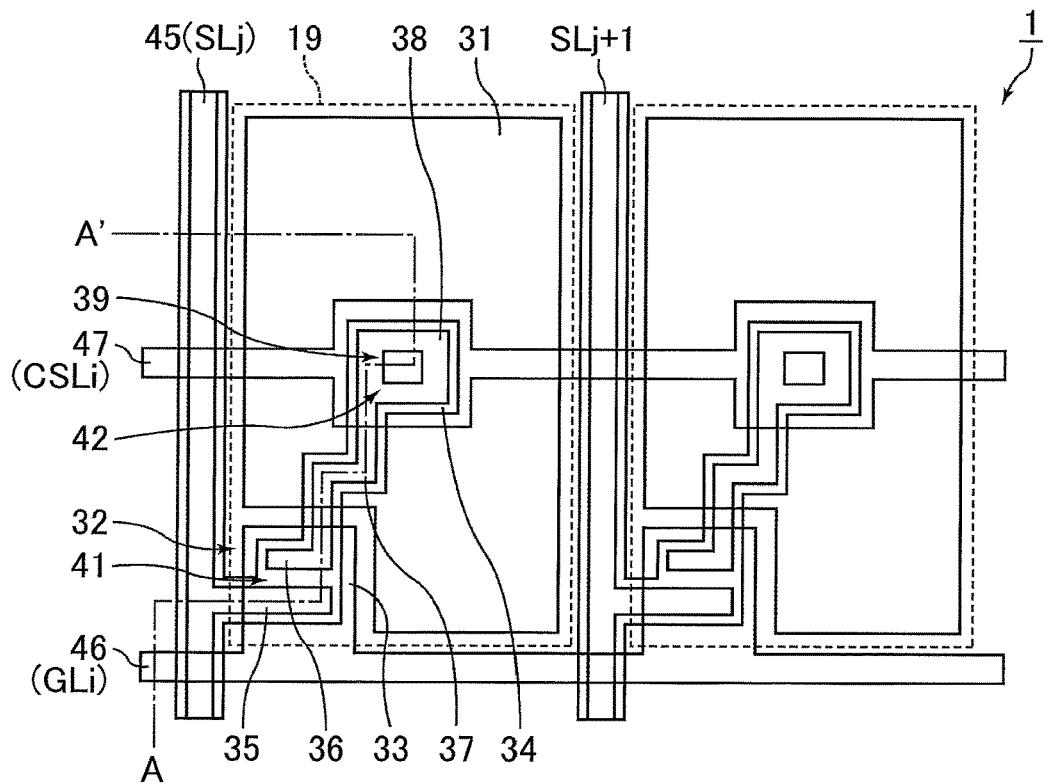
FIG. 4 is a diagram illustrating the active matrix substrate 1 of Embodiments 1 and 2, and is a plan view illustrating a configuration of a pixel 19 in a display region.
Figure 5:
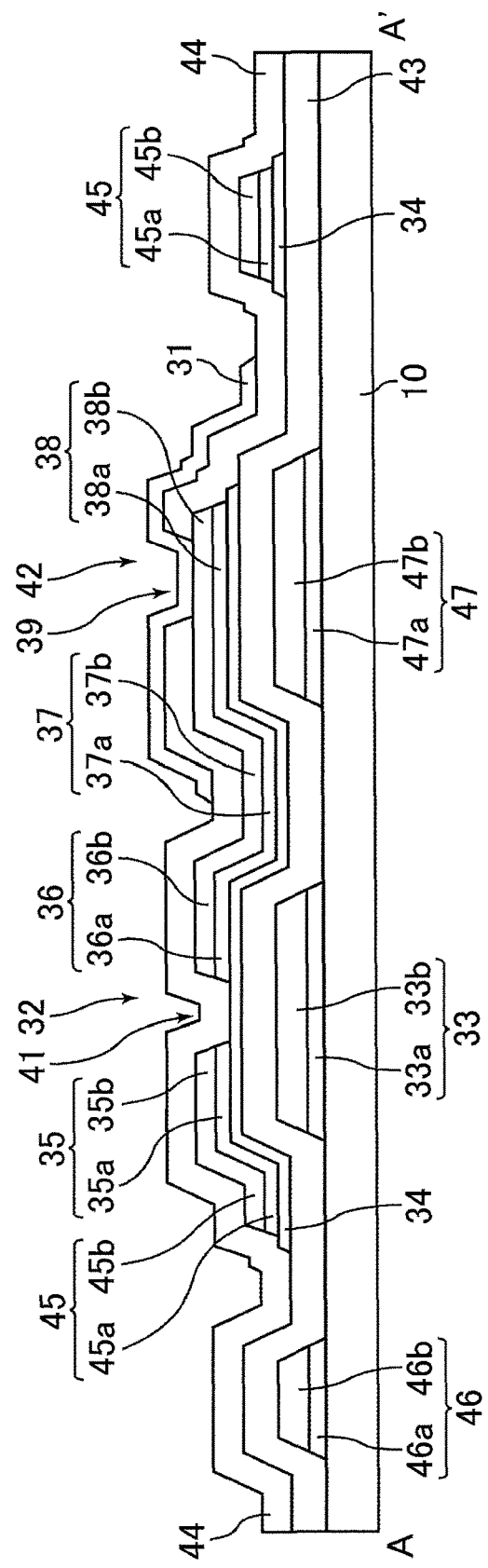
FIG. 5 is a cross-sectional view taken along line A-A' of FIG. 4.

FIGS. 4 and 5 are diagrams illustrating the active matrix substrate 1 of Embodiments 1 and 2, and FIG. 4 is a plan view illustrating a configuration of the pixel 19 in a display region. FIG. 5 is a cross-sectional view taken along line A-A' of FIG. 4. The pixel 19 has a pixel electrode 31 and a TFT 32. The TFT 32 has a gate electrode 33, a source electrode 35, and a drain electrode 36. Here, the gate electrode 33 is branched from the scan signal line 46 (GLi), and the source electrode 35 is branched from the data signal line 45 (SLj).

The drain electrode 36 is connected to a drain lead-out line (drain wiring line) 37, the drain lead-out line 37 is connected to an electrode 38, and the electrode 38 is connected to the pixel electrode 31 through a contact 39. An oxide semiconductor layer 34 is located on the entirety of the lower layer side (glass substrate 10 side) of the data signal line 45, the source electrode 35, the drain electrode 36, the drain lead-out line 37, and the electrode 38, but the pattern edge of the oxide semiconductor layer 34 is located further on the outside than the pattern edge of the data signal line 45, the source electrode 35, the drain electrode 36, the drain lead-out line 37, and the electrode 38. That is, the oxide semiconductor layer 34 is larger in width than the data signal line 45, the source electrode 35, the drain electrode 36, the drain lead-out line 37, and the electrode 38. A gap portion 41 of the TFT 32 is a region located between the source electrode 35 and the drain electrode 36, and the oxide semiconductor layer 34 is left even in this region.

A holding capacitance forming portion 42 is constituted by both a portion in which the holding capacitance wiring line 47 overlaps the pixel electrode 31 with a gate insulating layer 43 and an interlayer insulating layer 44 interposed therebetween and a portion in which the holding capacitance wiring line 47 overlaps the electrode 38 with the gate insulating layer 43 interposed therebetween. The capacitance formed herein is a holding capacitance, and contributes to the stability of a potential of the pixel electrode 31.

A more detailed description will be made with reference to FIG. 5. The scan signal line 46, the gate electrode 33, and the holding capacitance wiring line 47 are constituted by lower layers 46a, 33a, and 47a made of molybdenum, respectively, and upper layers 46b, 33b, and 47b made of copper, respectively, and are formed of the same gate metal layer as described later.

In addition, the data signal line 45, the source electrode 35, the drain electrode 36, the drain lead-out line 37, and the electrode 38 are constituted by lower layers 45a, 35a, 36a, 37a, and 38a made of molybdenum, respectively, and upper layers 45b, 35b, 36b, 37b, and 38b made of copper, respectively, and are formed of the same source metal layer.

FIGS. 6 to 11 are diagrams illustrating the active matrix substrate 1 of the present embodiment.

Figure 6:
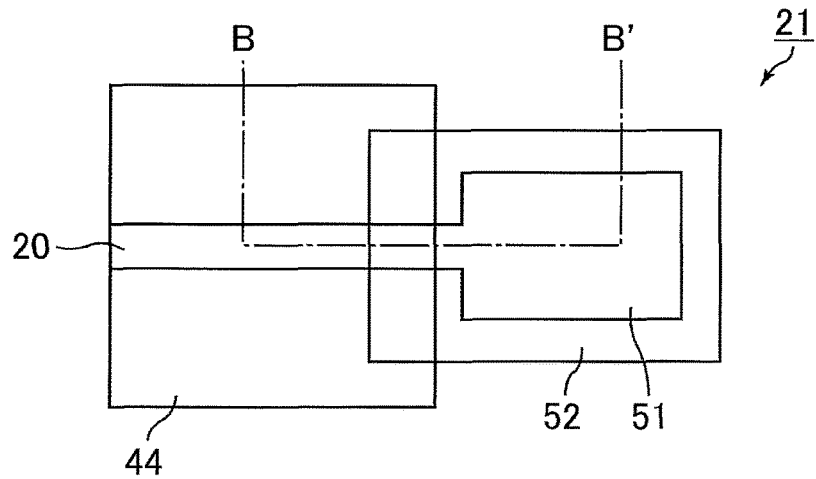
FIG. 6 is a schematic plan view illustrating a configuration of a gate terminal 21 in Embodiment 1.
Figure 7:
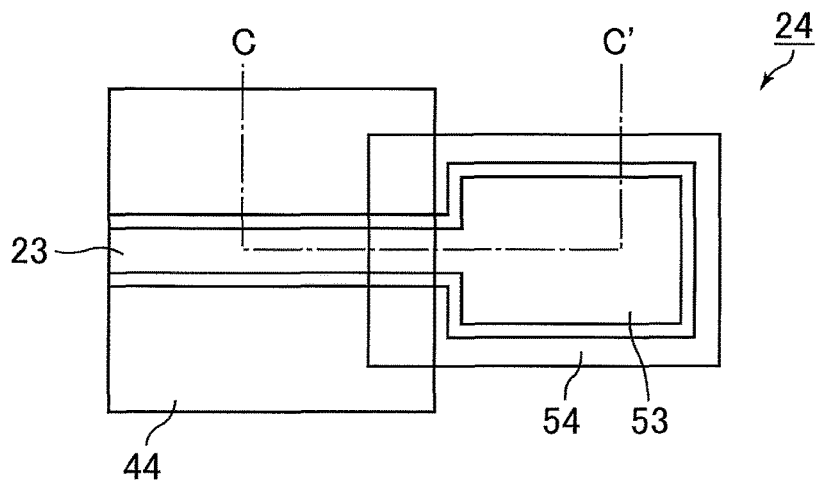
FIG. 7 is a schematic plan view illustrating a configuration of a source terminal 24 in Embodiment 1.
Figure 8:
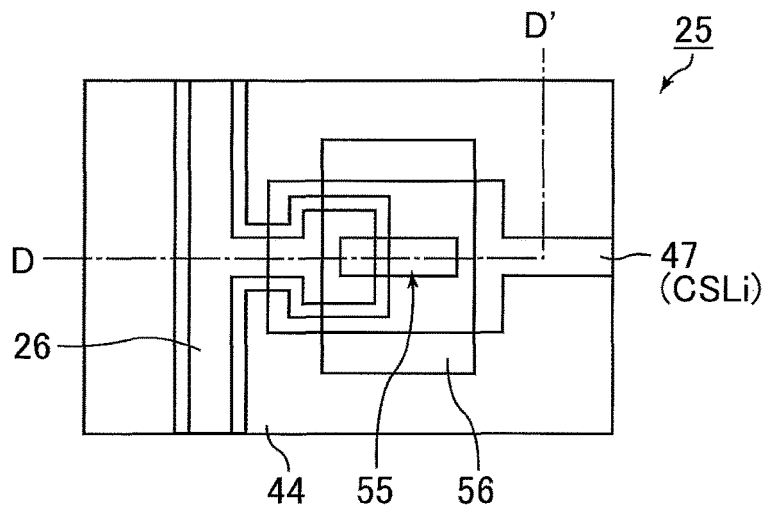
FIG. 8 is a schematic plan view illustrating a configuration of a contact 25 in Embodiment 1.

FIG. 6 is a schematic plan view illustrating a configuration of the gate terminal 21 in the present embodiment. FIG. 7 is a schematic plan view illustrating a configuration of the source terminal 24 in the present embodiment. FIG. 8 is a schematic plan view illustrating a configuration of the contact 25 in the present embodiment.

Figure 9:
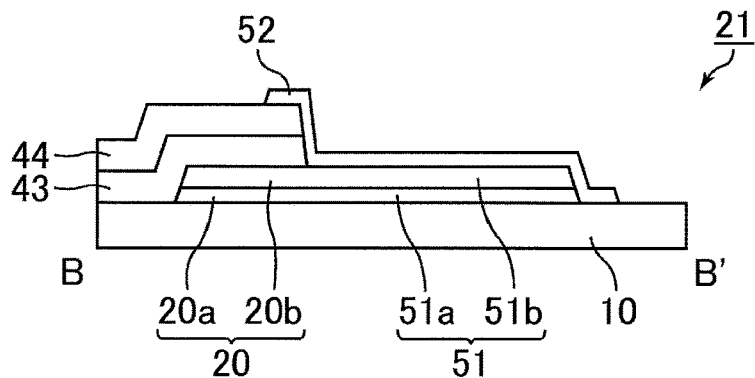
FIG. 9 is a schematic cross-sectional view taken along line B-B' of FIG. 6.
Figure 10:
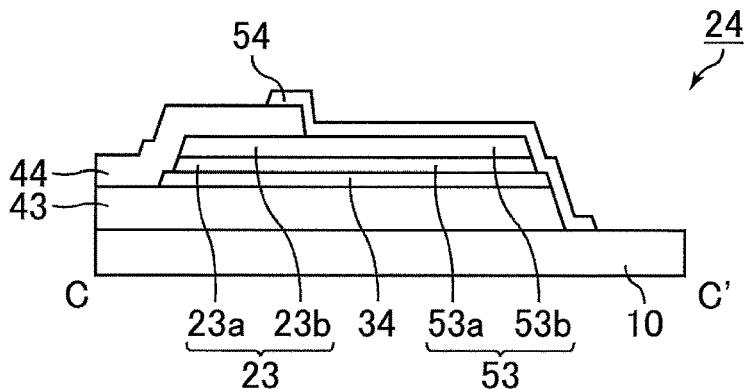
FIG. 10 is a schematic cross-sectional view taken along line C-C' of FIG. 7.
Figure 11:
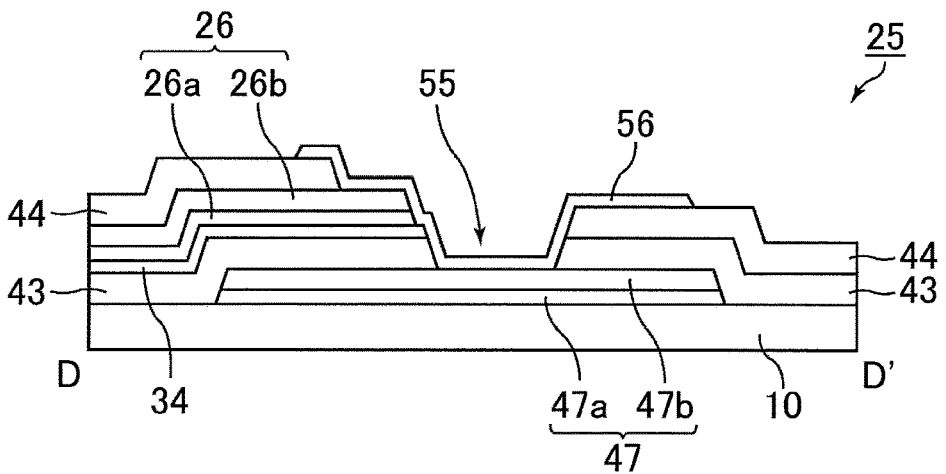
FIG. 11 is a schematic cross-sectional view taken along line D-D' of FIG. 8.

FIGS. 9, 10, and 11 are a schematic cross-sectional view taken along line B-B' of FIG. 6, a schematic cross-sectional view taken along line C-C' of FIG. 7, and a schematic cross-sectional view taken along line D-D' of FIG. 8, respectively.

Referring to FIG. 6 and FIG. 9 showing a section taken along line B-B' of FIG. 6, in the gate terminal 21, the gate lead-out line 20 is connected to a gate terminal metal layer 51, and the gate terminal metal layer 51 is connected to a transparent electrode layer 52 at a portion in which the gate insulating layer 43 and the interlayer insulating layer 44 are removed. Here, the transparent electrode layer 52 completely covers the gate terminal metal layer 51 including the pattern end thereof. The gate lead-out line 20 and the gate terminal metal layer 51 are constituted by lower layers 20a and 51a made of molybdenum, respectively, and upper layers 20b and 51b made of copper, respectively, and are formed of the same gate metal layer as the scan signal line 46 or the like in FIGS. 4 and 5.

Referring to FIG. 7 and FIG. 10 showing a section taken along line C-C' of FIG. 7, in the source terminal 24, the source lead-out line 23 is connected to a source terminal metal layer 53, and the source terminal metal layer 53 is connected to a transparent electrode layer 54 at a portion in which the interlayer insulating layer 44 is removed. Here, the transparent electrode layer 54 completely covers the source terminal metal layer 53 including the pattern end thereof. The source lead-out line 23 and the source terminal metal layer 53 are constituted by lower layers 23a and 53a made of molybdenum, respectively, and upper layers 23b and 53b made of copper, respectively, and are formed of the same source metal layer as the data signal line 45 or the like in FIGS. 4 and 5.

Referring to FIG. 8 and FIG. 11 showing a section taken along line D-D' of FIG. 8, an aperture 55 is provided so as to overlap the holding capacitance wiring line 47 and the holding capacitance wiring trunk 26 and expose a portion thereof, and the holding capacitance wiring line 47 and the holding capacitance wiring trunk 26 are connected to each other via an upper-layer connection electrode 56. The holding capacitance wiring trunk 26 is constituted by a lower layer 26a made of molybdenum and an upper layer 26b made of copper, and is formed of the same source metal layer as the data signal line 45 or the like in FIGS. 4 and 5.

Meanwhile, the holding capacitance wiring line terminal 28 has the same structure as that of the source terminal 24, and in FIGS. 7 and 10, the source lead-out line 23 may be replaced by the holding capacitance wiring trunk lead-out line 27. Thus, a detailed description thereof will be omitted.

Meanwhile, the configuration (the shape, the arrangement and the relation of connection of each member) of another pixel in the present embodiment is the same as that of the pixel 19 shown in FIGS. 4 and 5.

Process for Producing the Active Matrix Substrate 1

Figure 12:
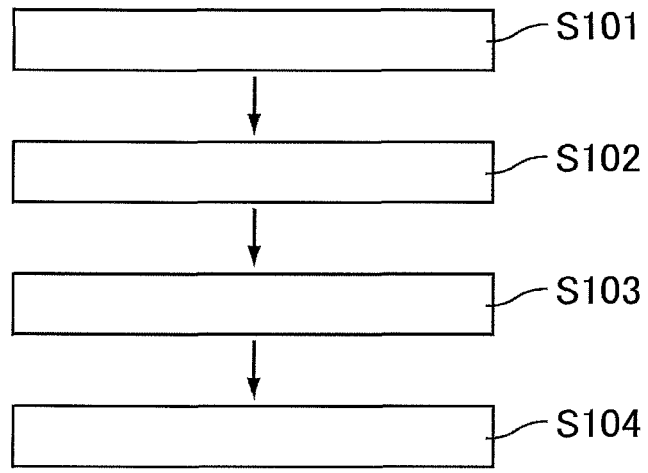
FIG. 12 is a process diagram illustrating steps of creating the active matrix substrate 1 of Embodiment 1.
Figure 13:
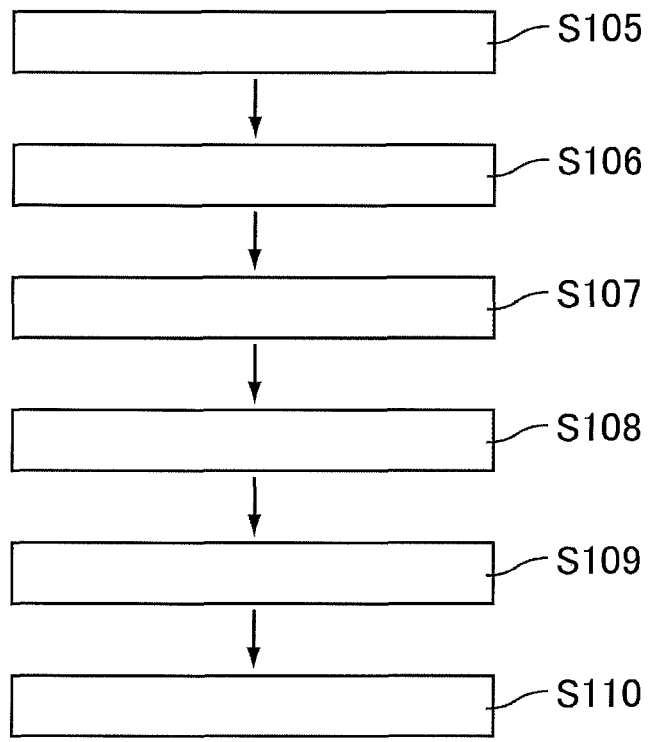
FIG. 13 is a process diagram specifically illustrating a semiconductor layer and source layer forming step S102 of Embodiment 1.

The active matrix substrate 1 of the present embodiment is created as process diagrams shown in FIGS. 12 and 13. Meanwhile, the active matrix substrate will be described below, but the present invention can also be applied to another circuit board.

FIG. 12 is a process diagram illustrating steps of creating the active matrix substrate 1 of the present embodiment.

FIG. 13 is a process diagram specifically illustrating a semiconductor layer and source layer forming step S102 of the present embodiment.

Specific steps of producing the active matrix substrate 1 include an example (Embodiment 1) in which a circuit board of which the channel portion of a TFT is made of an oxide semiconductor (for example, IGZO), the scan signal line is made of a Cu/Mo laminated film, and the data signal line is made of a Cu/Mo laminated film is created by using a four-mask process, and are as follows. That is, the above-mentioned production steps are as shown in FIG. 12, and include a gate layer forming step S101, a semiconductor layer and source layer forming step S102, an interlayer insulating layer forming step S103, and a pixel electrode layer forming step S104, using a four-mask process. Meanwhile, the present invention is particularly suited for a case where such a four-mask process (the same mask processing of a source metal layer and a semiconductor layer) is used.

Gate Layer Forming Step S101

Figure 14:
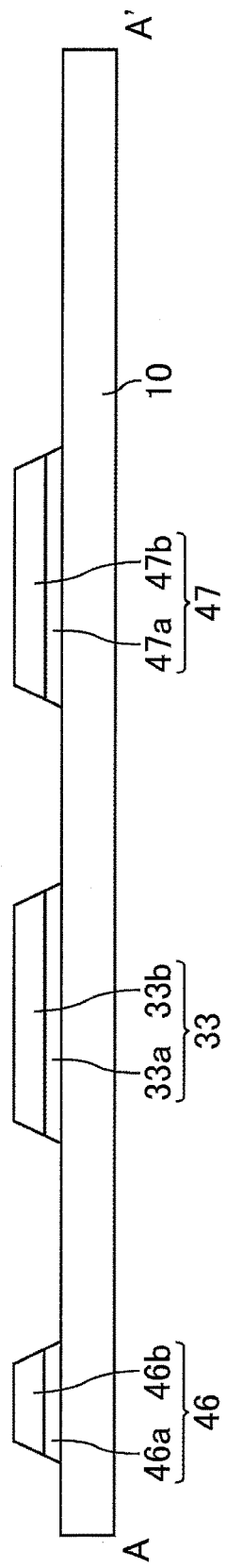
FIG. 14 is a cross-sectional view illustrating a section equivalent to line A-A' of FIG. 4 in a state where a gate layer forming step S101 is completed.
Figure 15:
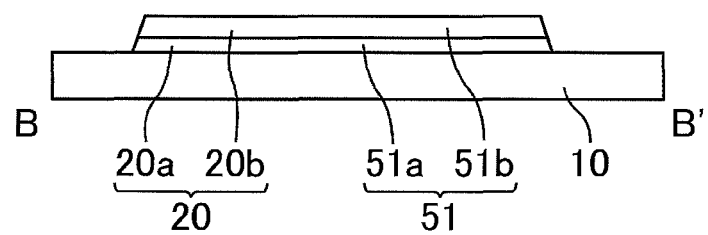
FIG. 15 is a cross-sectional view illustrating a section equivalent to line B-B' of FIG. 6 in a state where the gate layer forming step S101 is completed.
Figure 16:
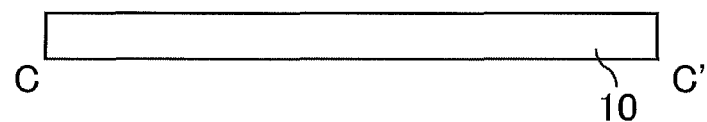
FIG. 16 is a cross-sectional view illustrating a section equivalent to line C-C' of FIG. 7 in a state where the gate layer forming step S101 is completed.
Figure 17:
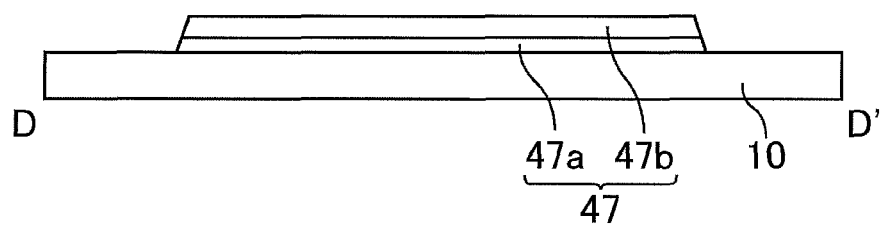
FIG. 17 is a cross-sectional view illustrating a section equivalent to line D-D' of FIG. 8 in a state where the gate layer forming step S101 is completed.

FIGS. 14 to 17 show a state where the gate layer forming step S101 is completed. FIG. 14 is a cross-sectional view illustrating a section equivalent to line A-A' of FIG. 4 in a state where the gate layer forming step S101 is completed. FIG. 15 is a cross-sectional view illustrating a section equivalent to line B-B' of FIG. 6 in a state where the gate layer forming step S101 is completed. FIG. 16 is a cross-sectional view illustrating a section equivalent to line C-C' of FIG. 7 in a state where the gate layer forming step S101 is completed. FIG. 17 is a cross-sectional view illustrating a section equivalent to line D-D' of FIG. 8 in a state where the gate layer forming step S101 is completed.

The gate layer forming step S101 includes a step of forming a Cu/Mo laminated film, a step of forming a resist pattern film out of a photoresist material by using a photolithographic method, a step of performing wet etching on the Cu/Mo laminated film, and a step of removing the resist pattern film. First, molybdenum (Mo) and copper (Cu) are deposited in order on the transparent insulating substrate (glass substrate 18 in FIG. 3) such as glass and plastic through a sputtering method using argon (Ar) gas, and a gate metal layer (not shown) which is a Cu/Mo laminated film is formed. At this time, the film thickness of molybdenum is set to, for example, 10 nm, and the film thickness of copper is set to, for example, 300 nm. In the present embodiment, the temperature of the glass substrate 10 at the time of forming the gate metal layer is set to, for example, 100 to 200° C.

Subsequently, a resist pattern film is formed by using a photolithographic method, that is, a resist pattern film is formed on a target film out of a photoresist material. The scan signal line 46, the gate electrode 33, the holding capacitance wiring line 47, the gate lead-out line 20, and the gate terminal metal layer 51 are formed of a gate metal layer by using a method of patterning a Cu/Mo laminated film using this resist pattern film as a mask.

Here, the scan signal line 46, the gate electrode 33, the holding capacitance wiring line 47, the gate lead-out line 20, and the gate terminal metal layer 51 have a two-layer structure, each of the lower layers thereof is made of molybdenum, and each of the upper layers thereof is made of copper.

The etching of the gate metal layer at this time can be performed by a wet etching method using an etchant containing hydrogen peroxide ($H_2O_2$) and nitric acid ($HNO_3$). More specifically, the etchant containing hydrogen peroxide ($H_2O_2$) and nitric acid ($HNO_3$) may be an etchant composed of 2 wt % hydrogen peroxide ($H_2O_2$), 1 wt % nitric acid ($HNO_3$), and balance water, and the solution temperature of the etchant may be set to, for example, 24° C.

Meanwhile, in the etching of the gate metal layer, an arbitrary acid can be used instead of nitric acid, and the etchant containing hydrogen peroxide ($H_2O_2$) and nitric acid ($HNO_3$) may be an etchant containing hydrogen peroxide ($H_2O_2$) and an arbitrary acid. As this arbitrary acid, inorganic acids such as sulfuric acid, persulfuric acid (peroxomonosulfuric acid), hydrochloric acid, phosphoric acid, and hydrobromic acid and organic acids such as citric acid, oxalic acid, and acetic acid can be used, and implementation can be made in the same way.

In addition, in the etching of the gate metal layer, an etchant in the related art containing phosphoric acid, acetic acid and nitric acid can also be used.

In the present embodiment, the gate metal layer may be formed of a metal layer containing molybdenum and a metal layer containing copper from the glass substrate 10 side, the production yield rate of the active matrix substrate can be improved similarly by using the same etchant.

In the present embodiment, the metal containing molybdenum is a molybdenum-based metal and the molybdenum content may be equal to or more than 50 wt %, and the copper content of the metal containing copper may be equal to or more than 50 wt %. More preferably, the molybdenum content of the metal containing molybdenum may be equal to or more than 80 wt %, and the copper content of the metal containing copper may be equal to or more than 80 wt %. The metal containing molybdenum may be a molybdenum alloy containing molybdenum and one or more elements selected from nitrogen, oxygen, vanadium, niobium, neodymium, copper, tungsten, titanium, and tantalum, and the metal containing copper may be an alloy (copper alloy) containing copper and one or more elements selected from nitrogen, oxygen, vanadium, niobium, neodymium, molybdenum, tungsten, titanium, and tantalum. Further, the metal layer containing molybdenum and the metal layer containing copper may have a laminated structure, and these layers may be a metal layer containing molybdenum and a metal layer containing copper, respectively, as a whole.

Semiconductor Layer and Source Layer Forming Step S102

The semiconductor layer and source layer forming step S102 includes a deposition step S105, a resist pattern film forming step S106, a first etching step (wet etching) S107, an asking step S108, a second etching step (wet etching) S109, and a resist removing step S110.

Deposition Step S105 and Resist Pattern Film Forming Step S106

Figure 18:
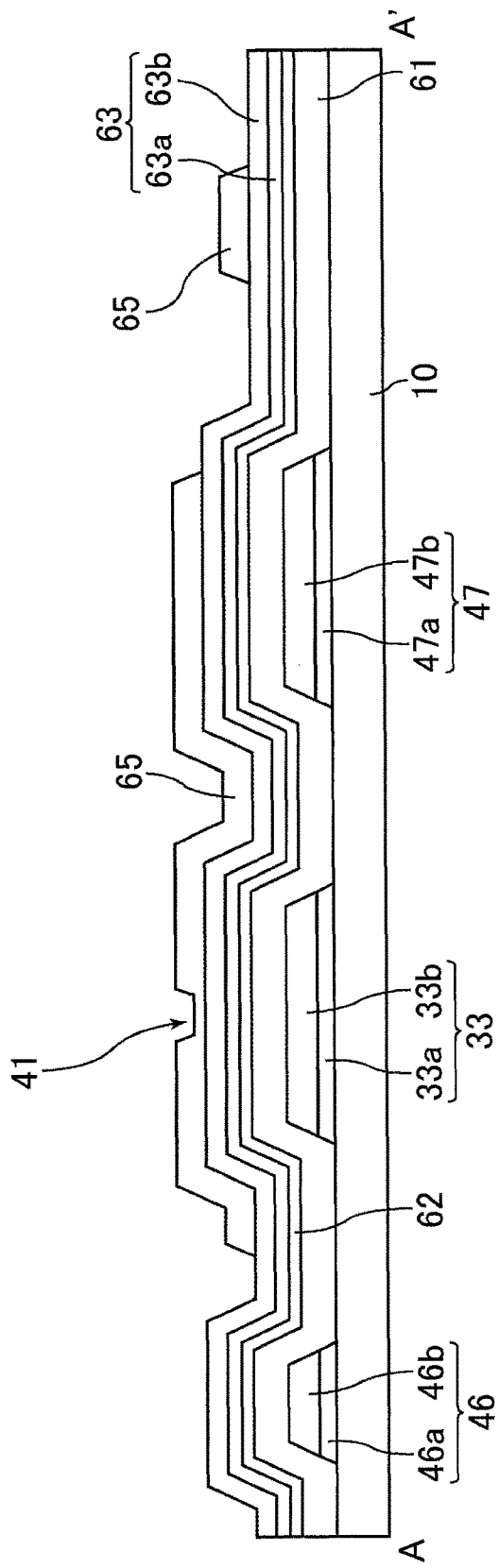
FIG. 18 is a cross-sectional view illustrating a section equivalent to line A-A' of FIG. 4 in a state where a resist pattern film forming step S106 is completed.
Figure 19:
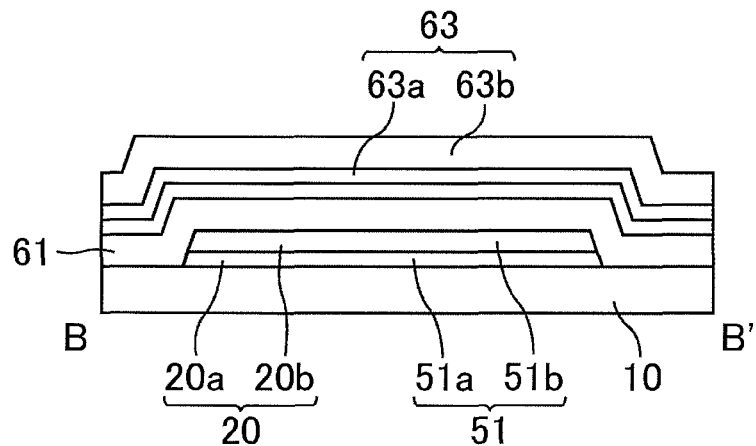
FIG. 19 is a cross-sectional view illustrating a section equivalent to line B-B' of FIG. 6 in a state where the resist pattern film forming step S106 is completed.
Figure 20:
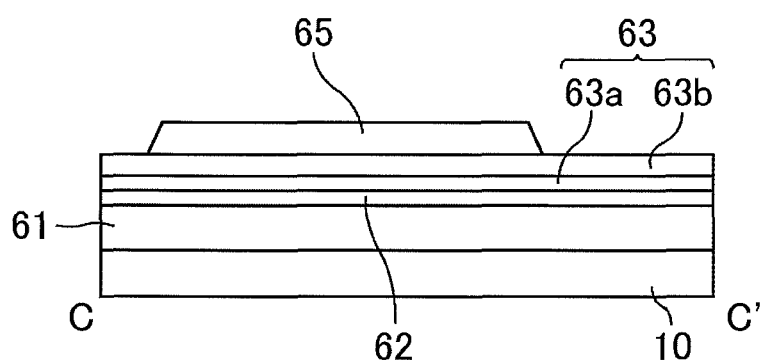
FIG. 20 is a cross-sectional view illustrating a section equivalent to line C-C' of FIG. 7 in a state where the resist pattern film forming step S106 is completed.
Figure 21:
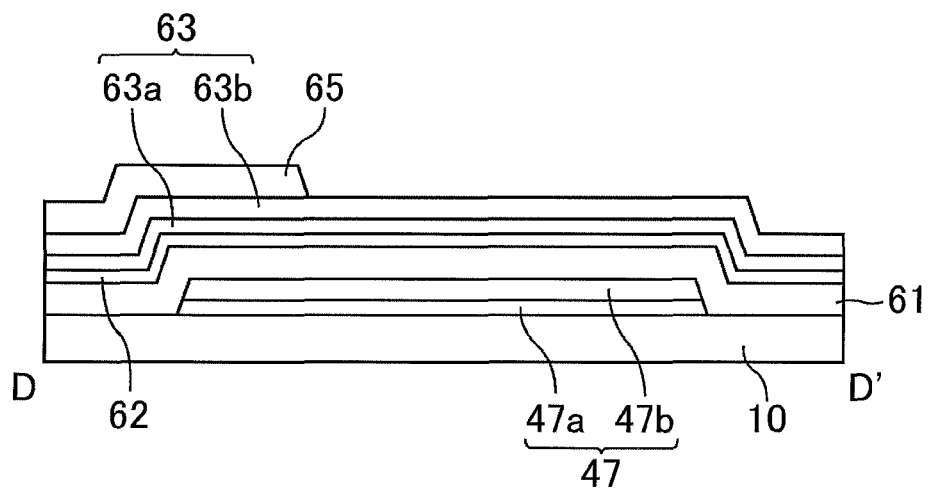
FIG. 21 is a cross-sectional view illustrating a section equivalent to line D-D' of FIG. 8 in a state where the resist pattern film forming step S106 is completed.

FIGS. 18 to 21 show a state where the resist pattern film forming step S106 of the semiconductor layer and source layer forming step S102 is completed. FIG. 18 is a cross-sectional view illustrating a section equivalent to line A-A' of FIG. 4 in a state where the resist pattern film forming step S106 is completed. FIG. 19 is a cross-sectional view illustrating a section equivalent to line B-B' of FIG. 6 in a state where the resist pattern film forming step S106 is completed. FIG. 20 is a cross-sectional view illustrating a section equivalent to line C-C' of FIG. 7 in a state where the resist pattern film forming step S106 is completed. FIG. 21 is a cross-sectional view illustrating a section equivalent to line D-D' of FIG. 8 in a state where the resist pattern film forming step S106 is completed.

In the deposition step S105 and the resist pattern film forming step S106, an insulating layer 61, an oxide semiconductor layer (IGZO) 62, and a source metal layer 63 are sequentially deposited from a state where the gate layer forming step S101 shown in FIGS. 14 to 17 is completed, and a resist pattern film 65 is formed by using the previous photolithographic method.

The portion (half resist portion) of which the resist pattern film thickness is smaller than those of others exists in the gap portion 41, and this portion is created by adjusting the amount of exposure by using a photomask having three transmittances of transmission, non-transmission, and intermediate transmission depending on areas.

The insulating layer 61 is formed of a silicon nitride film ($SiN_x$) and a silicon oxide film ($SiO_x$) from the glass substrate 10 side. A plasma CVD method is used in depositing these films. As deposition gas, gas such as silane ($SiH_4$), ammonia ($NH_3$), hydrogen ($H_2$) and nitrogen ($N_2$) is used in the case of the silicon nitride film, and gas such as silane ($SiH_4$) and dinitrogen monoxide ($N_2O$) is used in the case of the silicon oxide film. The thickness of the silicon nitride film is set to, for example, 325 nm, and the thickness of the silicon oxide film is set to 50 nm. The temperature of the glass substrate 10 at the time of the deposition thereof is set to, for example, 200 to 300° C.

However, the present invention is not limited by the film thickness and the configuration of the insulating layer 61. As another form, the insulating layer 61 may be configured so that only either of the silicon nitride film ($SiN_x$) or the silicon oxide film ($SiO_x$) is deposited, and may be configured to include aluminum oxide ($Al_2O_3$), tantalum pentoxide ($Ta_2O_5$), and titanium dioxide ($TiO_2$).

The oxide semiconductor layer 62 is deposited by a sputtering method using argon (Ar) gas. As a sputtering target, a sputtering target is used in which a mixture of indium oxide ($In_2O_3$), gallium oxide ($Ga_2O_3$), and zinc oxide (ZnO) is processed as a sintered compact. The ratio (atomic ratio) of indium:gallium:zinc contained in the obtained oxide semiconductor layer 62 is adjusted to be a composition ratio of 1:1:1. In the present embodiment, the temperature of the glass substrate 10 at the time of forming the oxide semiconductor layer 62 is set to, for example, 100 to 200° C.

However, the present invention is not limited to this range by the film thickness and the configuration of the oxide semiconductor layer 62, the ratio (atomic ratio) of indium:gallium:zinc can be applied similarly even when the ratio is different.

The source metal layer 63 is formed of a Cu/Mo laminated film, and is formed by depositing molybdenum (Mo) and copper (Cu) in order, similarly to the gate metal layer. At this time, the film thickness of molybdenum is set to, for example, 10 nm, and the film thickness of copper is set to, for example, 300 nm. In the present embodiment, the temperature of the glass substrate 10 at the time of forming the source metal layer 63 is set to, for example, 100 to 200° C.

First Etching Step (Wet Etching) S107

Figure 22:
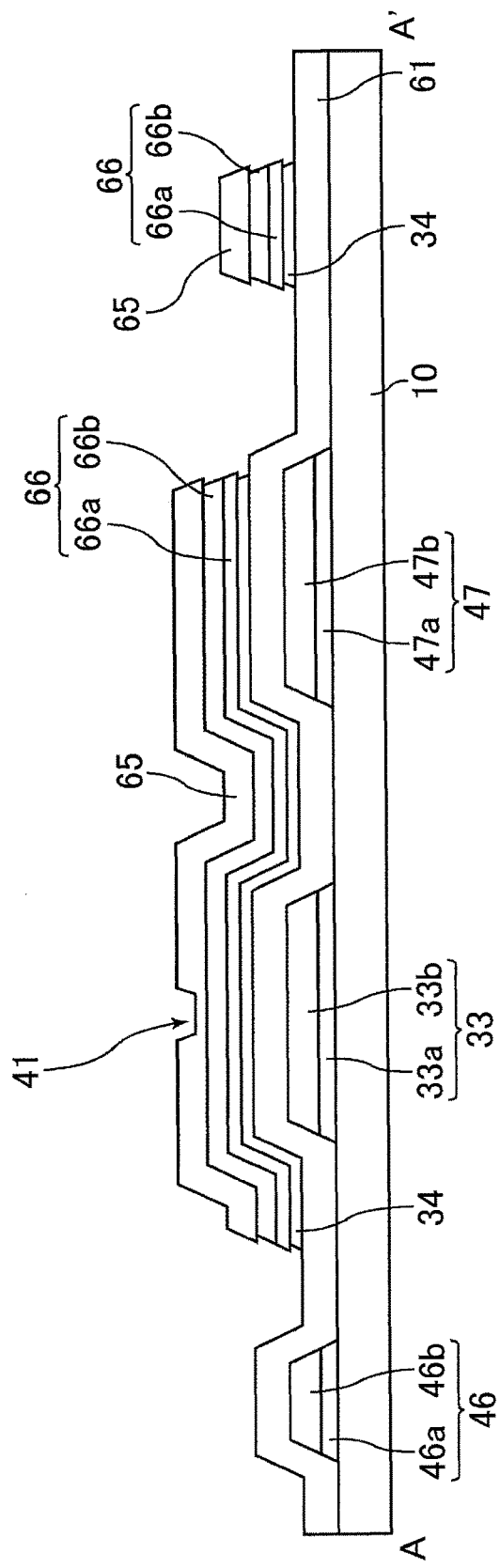
FIG. 22 is a cross-sectional view illustrating a section equivalent to line A-A' of FIG. 4 in a state where a first etching step S107 is completed.
Figure 23:
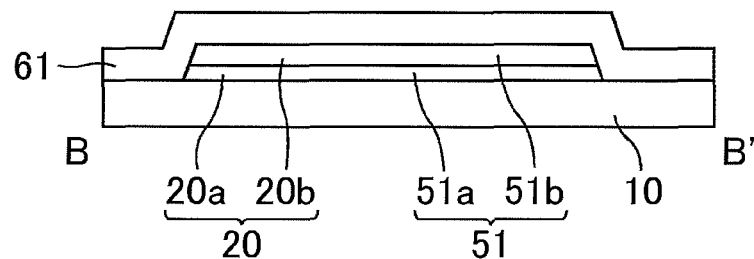
FIG. 23 is a cross-sectional view illustrating a section equivalent to line B-B' of FIG. 6 in a state where the first etching step S107 is completed.
Figure 24:
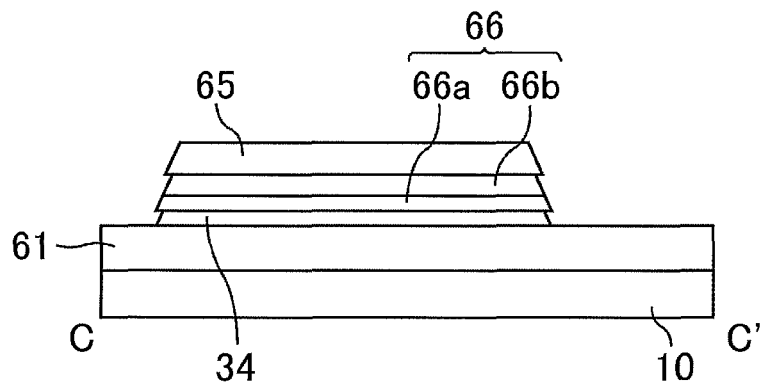
FIG. 24 is a cross-sectional view illustrating a section equivalent to line C-C' of FIG. 7 in a state where the first etching step S107 is completed.
Figure 25:
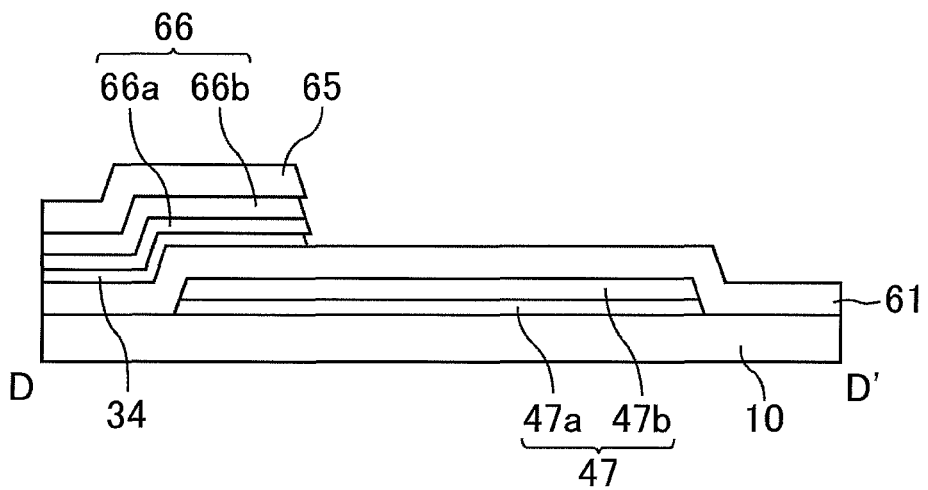
FIG. 25 is a cross-sectional view illustrating a section equivalent to line D-D' of FIG. 8 in a state where the first etching step S107 is completed.

FIGS. 22 to 25 show a state where the first etching step S107 of the semiconductor layer and source layer forming step S102 is completed. FIG. 22 is a cross-sectional view illustrating a section equivalent to line A-A' of FIG. 4 in a state where the first etching step S107 is completed. FIG. 23 is a cross-sectional view illustrating a section equivalent to line B-B' of FIG. 6 in a state where the first etching step S107 is completed. FIG. 24 is a cross-sectional view illustrating a section equivalent to line C-C' of FIG. 7 in a state where the first etching step S107 is completed. FIG. 25 is a cross-sectional view illustrating a section equivalent to line D-D' of FIG. 8 in a state where the first etching step S107 is completed. From a state where the resist pattern film forming step S106 shown in FIGS. 18 to 21 is completed, the oxide semiconductor layer 62 and the source metal layer 63 are patterned by a two-step wet etching method using an etchant containing hydrogen peroxide and nitric acid and an etchant containing oxalic acid (HOOC—COOH).

More specifically, the etchant containing hydrogen peroxide and nitric acid may be an etchant composed of 2 wt % hydrogen peroxide ($H_2O_2$), 1 wt % nitric acid ($HNO_3$), and balance water, and the etchant containing oxalic acid (HOOC—COOH) may be an etchant composed of 4 to 5 wt % oxalic acid (HOOC—COOH) and balance water. The solution temperature of these etchants may be set to, for example, 24° C.

Thereby, the oxide semiconductor layer 34 is formed from the oxide semiconductor layer 62, and a primary processing layer 66 of the source metal layer is formed from the source metal layer 63.

This two-step wet etching method will be described in more detail. In the first step, the source metal layer 63 is etched by using the etchant containing hydrogen peroxide and nitric acid, and in the second step, the oxide semiconductor layer 62 is etched by using the etchant containing oxalic acid (HOOC—COOH). When the etchant containing hydrogen peroxide and nitric acid is used, the oxide semiconductor layer 62 is hardly etched. In the above-mentioned second step, when the etchant containing oxalic acid (HOOC—COOH) is used, the source metal layer 63 formed of the molybdenum layer and the copper layer is hardly etched. Therefore, it is possible to improve the production yield rate of the active matrix substrate without giving unnecessary etching damage to the primary processing layer 66 of the source metal layer in such two-step wet etching.

As in the related art, when an etchant containing phosphoric acid, acetic acid and nitric acid is used in etching the source metal layer 63 and the oxide semiconductor layer 62, the oxide semiconductor layer 62 and the source metal layer 63 can be etched at one time, but controllability is low in such an etching method. This is because when the etchant in the related art containing phosphoric acid, acetic acid and nitric acid is used, the etching rate of the oxide semiconductor layer 62 increases considerably further than the etching rate of the source metal layer 63 and the oxide semiconductor layer 62 located below the resist pattern film 65 is considerably etched, and thus the primary processing layer 66 of the source metal layer tends to be removed. Therefore, it is difficult to produce the active matrix substrate.

Here, the primary processing layer 66 of the source metal layer is constituted by a lower layer 66a made of molybdenum and an upper layer 66b made of copper, and the pattern end (edge) of the lower layer 66a has a width larger than that of the upper layer 66b (forward lamination state). However, the pattern end (edge) of the lower layer 66a has a width larger than that of the oxide semiconductor layer 34 (backward lamination state). This is because overetching is performed in order to reliably perform the etching of the oxide semiconductor layer 62 which is the second step. Since the etching of the oxide semiconductor layer 62 is reliably performed, the shape of the pattern end in such a backward lamination state can make the production yield rate of the active matrix substrate improve.

Meanwhile, in the first step described earlier, an arbitrary acid can be used instead of nitric acid, and the etchant containing hydrogen peroxide ($H_2O_2$) and nitric acid ($HNO_3$) may be an etchant containing hydrogen peroxide ($H_2O_2$) and an arbitrary acid. As this arbitrary acid, inorganic acids such as sulfuric acid, persulfuric acid (peroxomonosulfuric acid), hydrochloric acid, phosphoric acid, and hydrobromic acid and organic acids such as citric acid, oxalic acid, and acetic acid can be used, and implementation can be made in the same way.

Meanwhile, in the first etching step S107 of the present embodiment, the etchant containing hydrogen peroxide and nitric acid and the etchant containing oxalic acid (HOOC—COOH) are filled within separate etching baths, and the source metal layer 63 and the oxide semiconductor layer 62 are separately etched within each of the baths, which is preferable from the viewpoint of preventing the etchants from being mixed. Further, cleaning is performed by providing pure water cleaning equipment between the etching baths of the source metal layer 63 and that of the oxide semiconductor layer 62, which is more preferable from the viewpoint of preventing the etchants from being mixed.

Ashing Step S108

Figure 26:
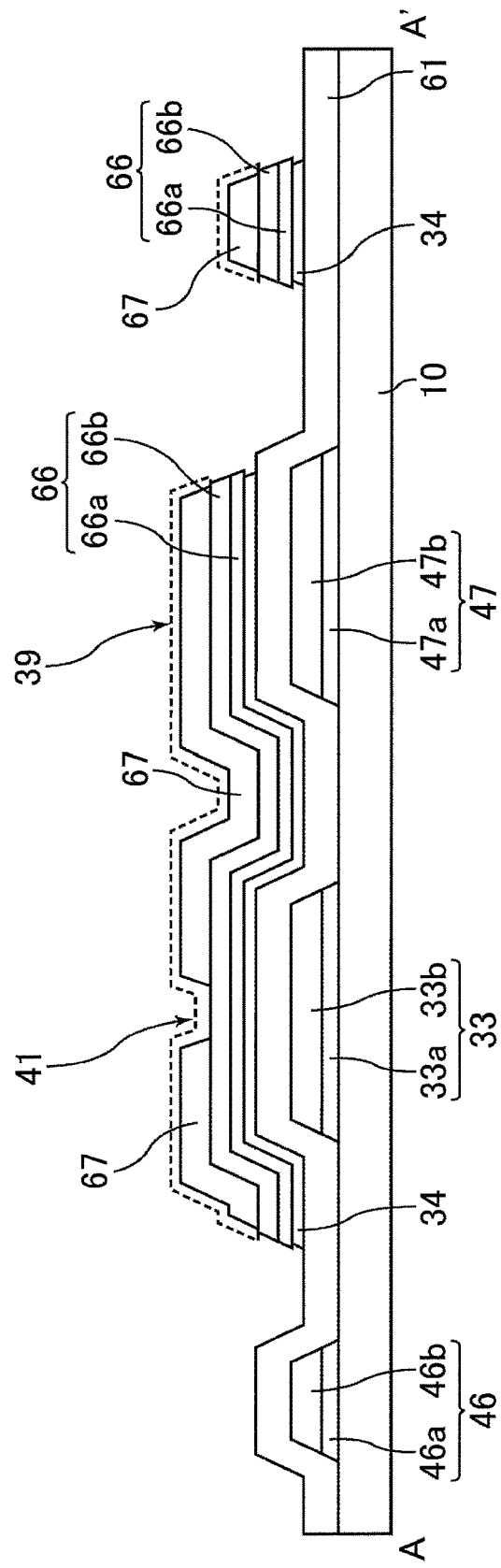
FIG. 26 is a cross-sectional view illustrating a section equivalent to line A-A' of FIG. 4 in a state where an ashing step S108 is completed.
Figure 27:
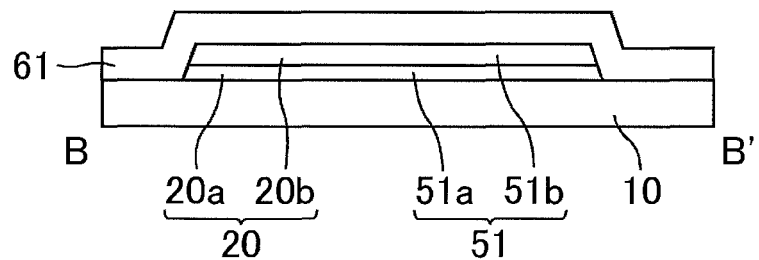
FIG. 27 is a cross-sectional view illustrating a section equivalent to line B-B' of FIG. 6 in a state where the ashing step S108 is completed.
Figure 28:
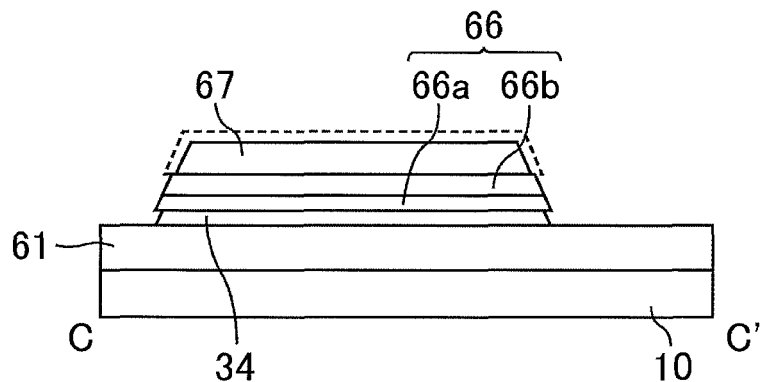
FIG. 28 is a cross-sectional view illustrating a section equivalent to line C-C' of FIG. 7 in a state where the ashing step S108 is completed.
Figure 29:
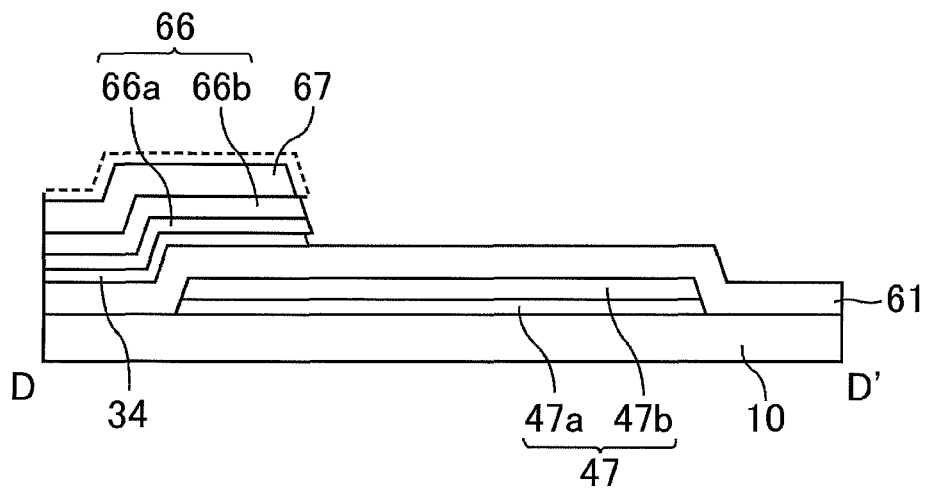
FIG. 29 is a cross-sectional view illustrating a section equivalent to line D-D' of FIG. 8 in a state where the ashing step S108 is completed.

FIGS. 26 to 29 show a state where the asking step S108 of the semiconductor layer and source layer forming step S102 is completed. FIG. 26 is a cross-sectional view illustrating a section equivalent to line A-A' of FIG. 4 in a state where the ashing step S108 is completed. FIG. 27 is a cross-sectional view illustrating a section equivalent to line B-B' of FIG. 6 in a state where the ashing step S108 is completed. FIG. 28 is a cross-sectional view illustrating a section equivalent to line C-C' of FIG. 7 in a state where the ashing step S108 is completed. FIG. 29 is a cross-sectional view illustrating a section equivalent to line D-D' of FIG. 8 in a state where the ashing step S108 is completed.

From a state where the first etching step S107 shown in FIGS. 22 to 25 is completed, ashing is performed so that the resist pattern film 65 of the half resist portion existing in the gap portion 41 disappears by using an atmospheric pressure plasma device, and a resist pattern film 67 is obtained from the resist pattern film 65. Meanwhile, in FIGS. 26, 28 and 29, for the purpose of reference, the shape of the resist pattern film 65 immediately before the ashing step S108 is indicated by the broken line. In addition, in ashing at this time, the temperature of the substrate 10 may be set to 100° C., for example, using mixed gas such as oxygen ($O_2$) gas and argon (Ar) gas.

Second Etching Step S109

Figure 30:
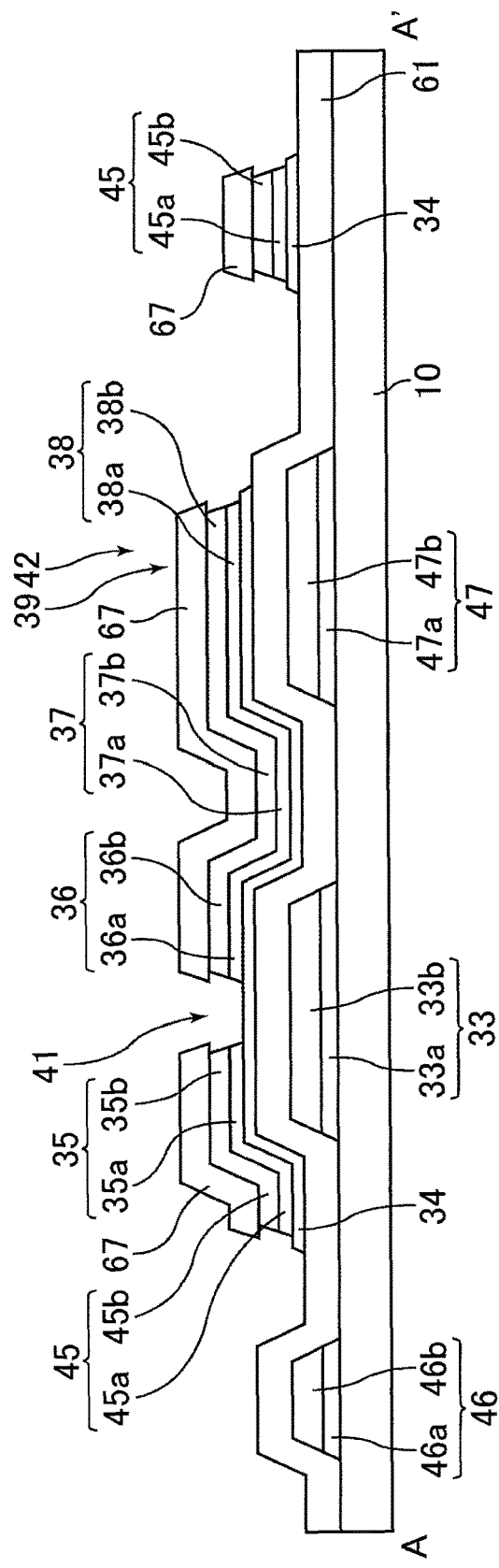
FIG. 30 is a cross-sectional view illustrating a section equivalent to line A-A' of FIG. 4 in a state where a second etching step S109 is completed.
Figure 31:
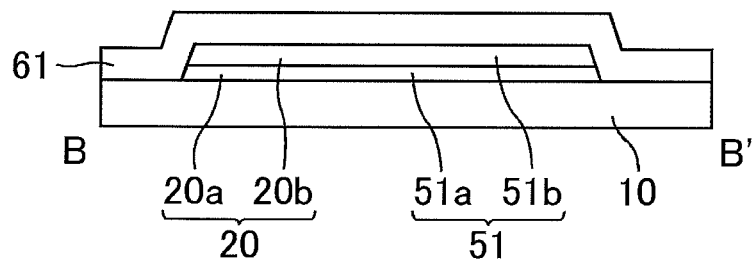
FIG. 31 is a cross-sectional view illustrating a section equivalent to line B-B' of FIG. 6 in a state where the second etching step S109 is completed.
Figure 32:
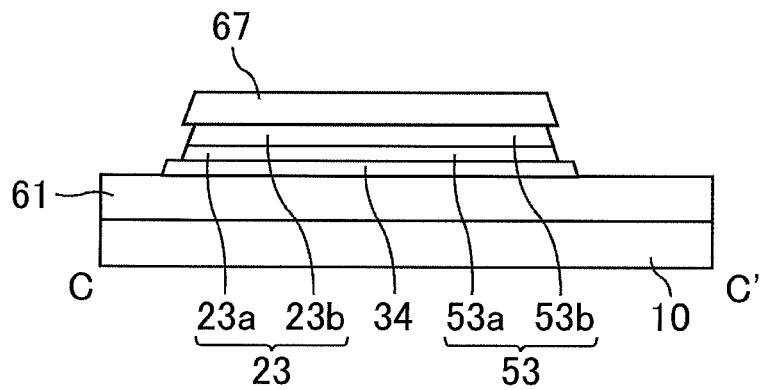
FIG. 32 is a cross-sectional view illustrating a section equivalent to line C-C' of FIG. 7 in a state where the second etching step S109 is completed.
Figure 33:
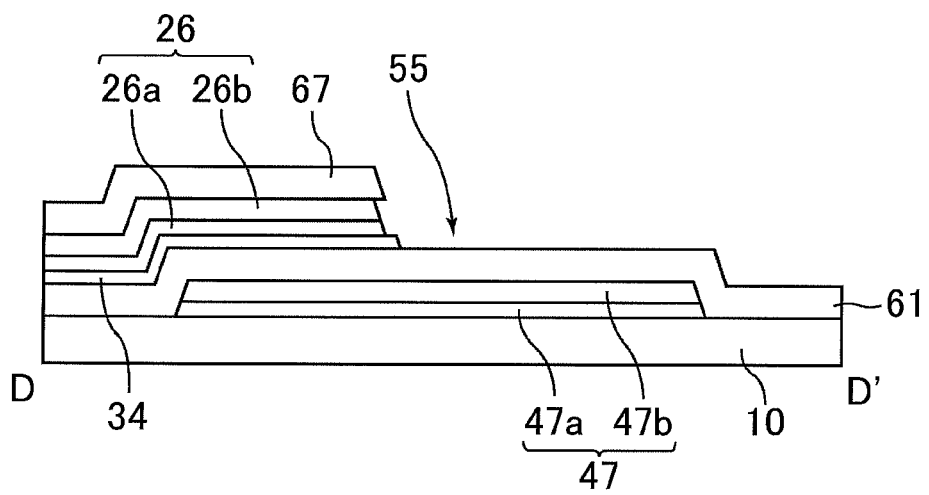
FIG. 33 is a cross-sectional view illustrating a section equivalent to line D-D' of FIG. 8 in a state where the second etching step S109 is completed.

FIGS. 30 to 33 show a state where the second etching step S109 of the semiconductor layer and source layer forming step S102 is completed. FIG. 30 is a cross-sectional view illustrating a section equivalent to line A-A' of FIG. 4 in a state where the second etching step S109 is completed. FIG. 31 is a cross-sectional view illustrating a section equivalent to line B-B' of FIG. 6 in a state where the second etching step S109 is completed. FIG. 32 is a cross-sectional view illustrating a section equivalent to line C-C' of FIG. 7 in a state where the second etching step S109 is completed. FIG. 33 is a cross-sectional view illustrating a section equivalent to line D-D' of FIG. 8 in a state where the second etching step S109 is completed.

From a state where the asking step S108 shown in FIGS. 26 to 29 is completed, the primary processing layer 66 of the source metal layer is etched by a wet etching method using the etchant containing hydrogen peroxide and nitric acid, and the data signal line 45, the source electrode 35, the drain electrode 36, the drain lead-out line 37, the electrode 38, the source lead-out line 23, and the source terminal metal layer 53 are formed from the primary processing layer 66 of the source metal layer. Here, etching is performed under the conditions in which the etching selectivity of the primary processing layer 66 of the source metal layer to the oxide semiconductor layer 34 is equal to or more than 2 so that the oxide semiconductor layer 34 made of an IGZO film is not etched, but the selectivity may be preferably equal to or more than 5. In the present embodiment, the etchant containing hydrogen peroxide and nitric acid is used for an etchant in this step, and the above-mentioned selectivity can be set to equal to or more than 5. When etching is performed with such a high selectivity, the oxide semiconductor layer 34 is hardly etched under the resist pattern film 67, and only the primary processing layer 66 of the source metal layer can be substantially subject to etching shift (side shift). In the present embodiment, as shown in the drawings, the pattern ends (edges) of the data signal line 45, the source electrode 35, the drain electrode 36 and the like are located further inside than the pattern end (edge) of the oxide semiconductor layer 34, and the oxide semiconductor layer 34 has a larger width. Therefore, the pattern end (edge) of the oxide semiconductor layer 34 does not move further inside than the pattern ends (edges) of the data signal line 45, the source electrode 35, the drain electrode 36 and the like, and disconnection or film separation does not occur in the data signal line 45, the source electrode 35, the drain electrode 36 and the like, thereby allowing the production yield rate to be improved. In addition, in the gap portion 41 of the TFT, since a decrease in the film thickness of the oxide semiconductor layer 34 is small, and the influence of the distribution rate in the plane of the substrate can be reduced, it is possible to stabilize the characteristics of the TFT in the plane of the substrate, to prevent a display defect, and to improve the production yield rate. At this time, angles (taper angles) in the pattern ends (edges) of the data signal line 45, the source electrode 35, the drain electrode 36 and the like are approximately the same as each other.

In the second etching step S109, similarly to the case mentioned in the first etching step S107, the etchant containing hydrogen peroxide and nitric acid is particularly used as an etchant. More specifically, the etchant containing hydrogen peroxide and nitric acid may be an etchant composed of 2 wt % hydrogen peroxide ($H_2O_2$), 1 wt % nitric acid ($HNO_3$), and balance water, the solution temperature of the etchant may be set to, for example, 24° C.

Here, an arbitrary acid can be used instead of nitric acid, and the etchant containing hydrogen peroxide and nitric acid may be an etchant containing hydrogen peroxide and an arbitrary acid. As this arbitrary acid, inorganic acids such as nitric acid, sulfuric acid, persulfuric acid (peroxomonosulfuric acid), hydrochloric acid, phosphoric acid, and hydrobromic acid and organic acids such as citric acid, oxalic acid, and acetic acid can be used, and implementation can be made in the same way.

Meanwhile, the taper angles of the source electrode 35, the drain electrode 36 and the like in the gap portion 41 are approximately the same as the taper angles of the source electrode 35, the drain electrode 36 in places other than the gap portion 41. This is because the taper angles of the source electrode 35, the drain electrode 36 and the like in the gap portion 41 and places other than the gap portion 41 are determined in the second etching step S109, and in such a case, for example, the taper angles of the source electrode 35, the drain electrode 36 and the like in the gap portion 41 become considerably lower than those in the places other than the gap portion 41. Thus, since leakage failure is prevented between the source electrode 35 and the drain electrode 36, it is possible to improve the production yield rate of the active matrix substrate.

In addition, the source metal layer 63 of the present embodiment may be formed of a metal layer containing molybdenum and a metal layer containing copper from the glass substrate 10 side, and the first etching step S107 and the second etching step S109 can be implemented similarly.

Here, the metal containing molybdenum is a molybdenum-based metal and the molybdenum content may be equal to or more than 50 wt %, and the copper content of the metal containing copper may be equal to or more than 50 wt %. More preferably, the molybdenum content of the metal containing molybdenum may be equal to or more than 80 wt %, and the copper content of the metal containing copper may be equal to or more than 80 wt %. The metal containing molybdenum may be a molybdenum alloy containing molybdenum and one or more elements selected from nitrogen, oxygen, vanadium, niobium, neodymium, copper, tungsten, titanium, and tantalum, and the metal containing copper may be an alloy containing copper and one or more elements selected from nitrogen, oxygen, vanadium, niobium, neodymium, molybdenum, tungsten, titanium, and tantalum. Further, the metal layer containing molybdenum and the metal layer containing copper may have a laminated structure. When these layers are a metal layer containing molybdenum and a metal layer containing copper, respectively, as a whole, implementation can be made in the same way.

Resist Removing Step S110

Figure 34:
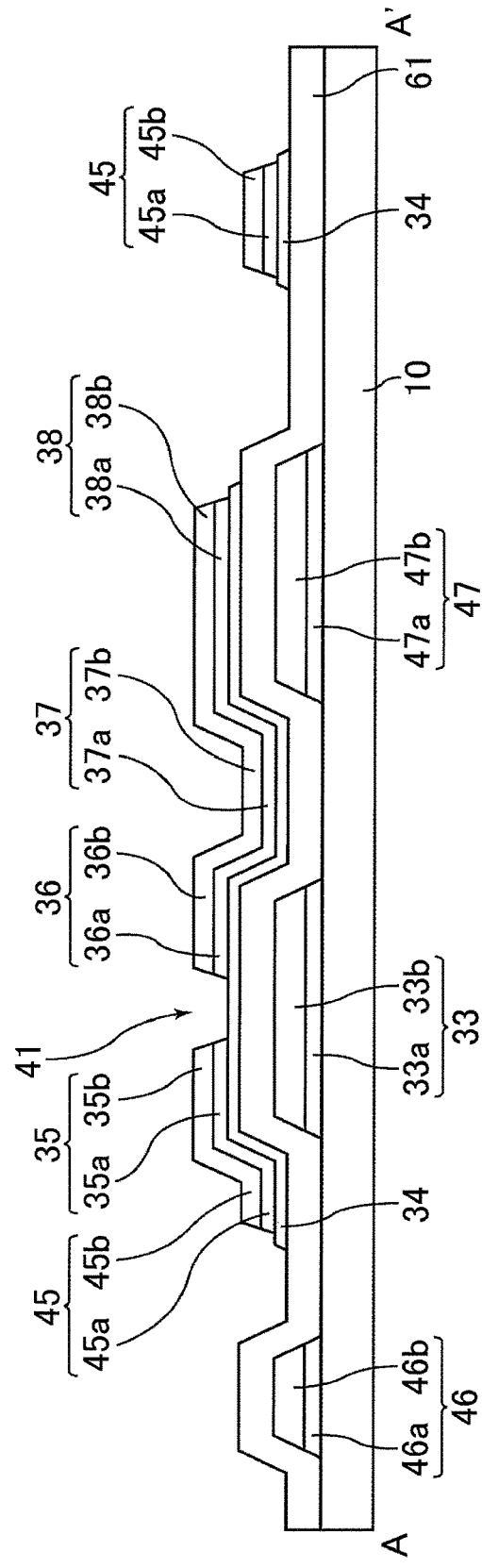
FIG. 34 is a cross-sectional view illustrating a section equivalent to line A-A' of FIG. 4 in a state where the semiconductor layer and source layer forming step S102 is completed.
Figure 35:
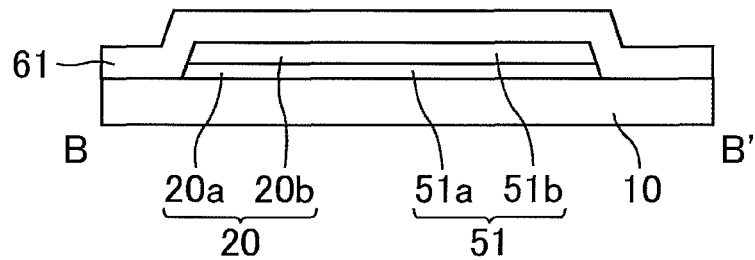
FIG. 35 is a cross-sectional view illustrating a section equivalent to line B-B' of FIG. 6 in a state where the semiconductor layer and source layer forming step S102 is completed.
Figure 36:
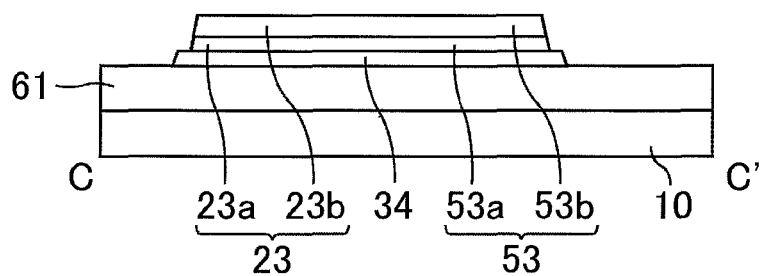
FIG. 36 is a cross-sectional view illustrating a section equivalent to line C-C' of FIG. 7 in a state where the semiconductor layer and source layer forming step S102 is completed.
Figure 37:
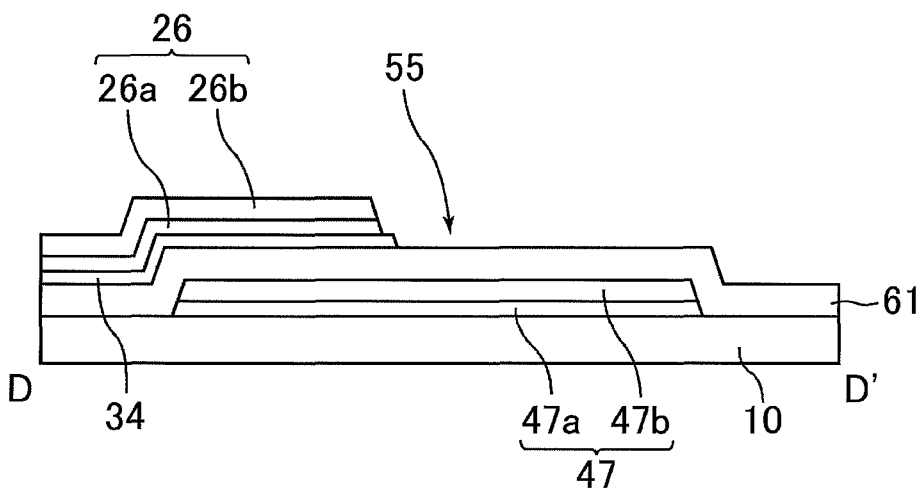
FIG. 37 is a cross-sectional view illustrating a section equivalent to line D-D' of FIG. 8 in a state where the semiconductor layer and source layer forming step S102 is completed.

FIGS. 34 to 37 show a state where the semiconductor layer and source layer forming step S102 is completed. FIG. 34 is a cross-sectional view illustrating a section equivalent to line A-A' of FIG. 4 in a state where the semiconductor layer and source layer forming step S102 is completed. FIG. 35 is a cross-sectional view illustrating a section equivalent to line B-B' of FIG. 6 in a state where the semiconductor layer and source layer forming step S102 is completed. FIG. 36 is a cross-sectional view illustrating a section equivalent to line C-C' of FIG. 7 in a state where the semiconductor layer and source layer forming step S102 is completed. FIG. 37 is a cross-sectional view illustrating a section equivalent to line D-D' of FIG. 8 in a state where the semiconductor layer and source layer forming step S102 is completed.

From a state where the second etching step S109 shown in FIGS. 30 to 33 is completed, the semiconductor layer and the source layer are obtained by removing the resist pattern film 67.

Interlayer Insulating Layer Forming Step S103

Figure 38:
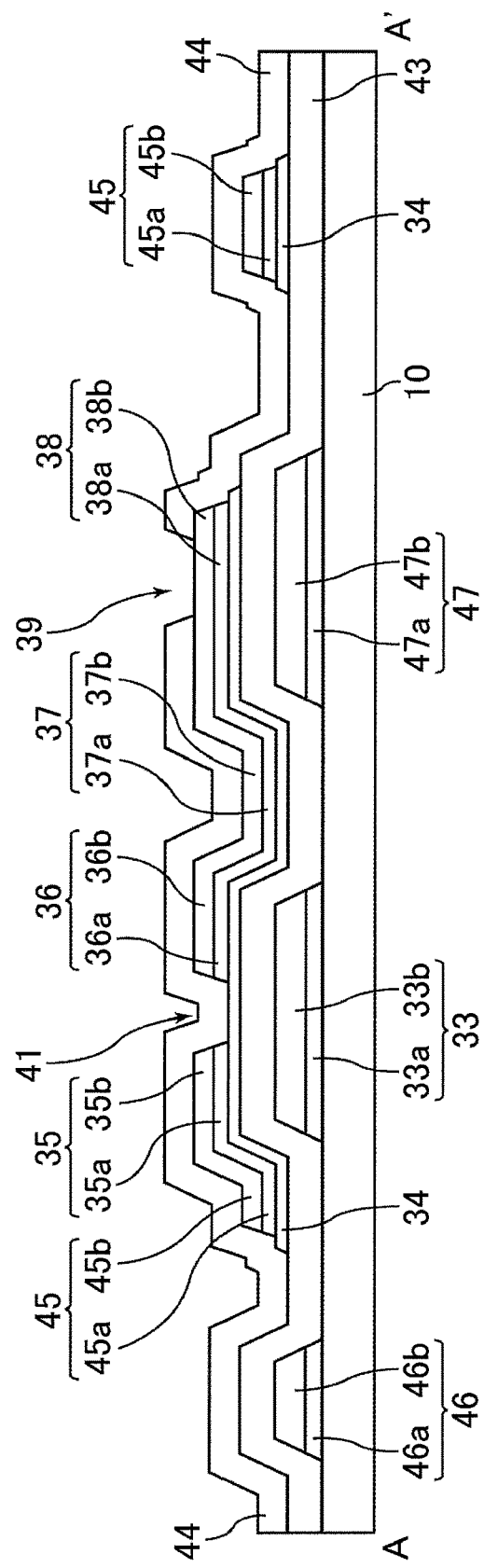
FIG. 38 is a cross-sectional view illustrating a section equivalent to line A-A' of FIG. 4 in a state where an interlayer insulating layer forming step S103 is completed.
Figure 39:
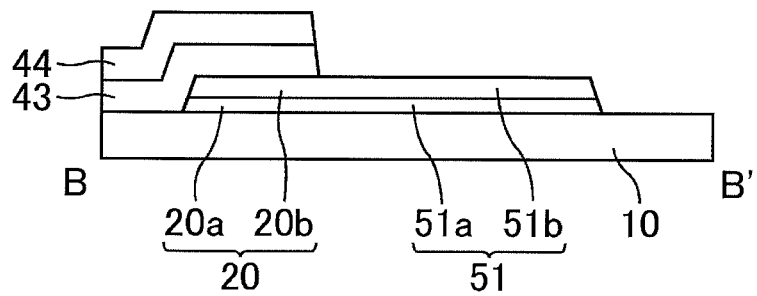
FIG. 39 is a cross-sectional view illustrating a section equivalent to line B-B' of FIG. 6 in a state where the interlayer insulating layer forming step S103 is completed.
Figure 40:
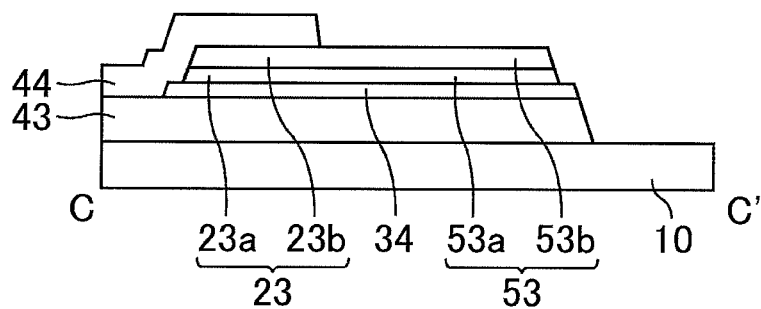
FIG. 40 is a cross-sectional view illustrating a section equivalent to line C-C' of FIG. 7 in a state where the interlayer insulating layer forming step S103 is completed.
Figure 41:
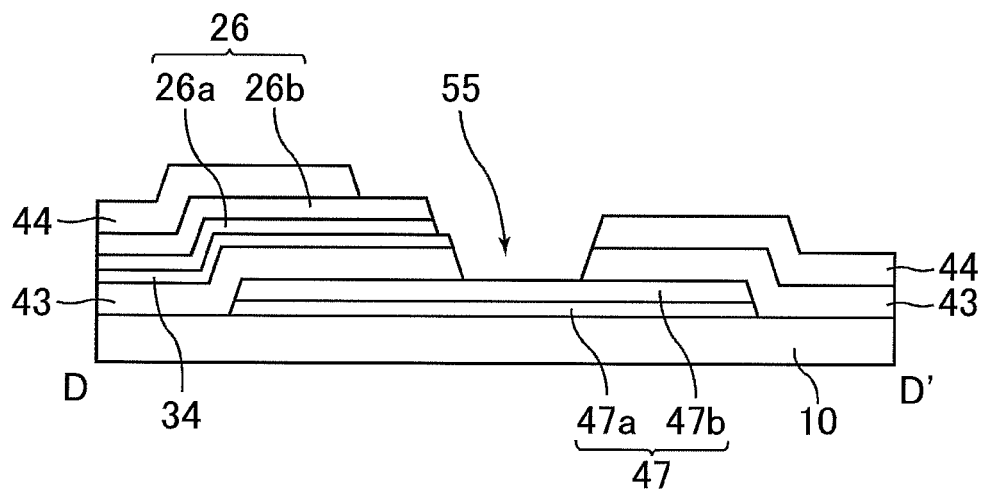
FIG. 41 is a cross-sectional view illustrating a section equivalent to line D-D' of FIG. 8 in a state where the interlayer insulating layer forming step S103 is completed.

FIGS. 38 to 41 show a state where the interlayer insulating layer forming step S103 is completed. FIG. 38 is a cross-sectional view illustrating a section equivalent to line A-A' of FIG. 4 in a state where the interlayer insulating layer forming step S103 is completed. FIG. 39 is a cross-sectional view illustrating a section equivalent to line B-B' of FIG. 6 in a state where the interlayer insulating layer forming step S103 is completed. FIG. 40 is a cross-sectional view illustrating a section equivalent to line C-C' of FIG. 7 in a state where the interlayer insulating layer forming step S103 is completed. FIG. 41 is a cross-sectional view illustrating a section equivalent to line D-D' of FIG. 8 in a state where the interlayer insulating layer forming step S103 is completed.

From a state where the semiconductor layer and source layer forming step S102 shown in FIGS. 34 to 37 is completed, the interlayer insulating layer 44 and the gate insulating layer 43 are formed.

Although not shown herein, the interlayer insulating layer 44 is formed of a silicon oxide film ($SiO_x$) having a film thickness of 30 nm and an organic insulating layer having a film thickness of 3 μm, from the lower layer side (glass substrate 10 side). Here, a plasma CVD method is used in the deposition of the silicon oxide film, and gas such as silane ($SiH_4$) and dinitrogen monoxide ($N_2O$) is used as deposition gas. In the present embodiment, the temperature of the glass substrate 10 at the time of forming the silicon oxide film is set to, for example, 100 to 200° C.

The organic insulating layer is formed by using a photosensitive resist material containing an acrylic resin, and the resist pattern film made of the above-mentioned material is formed by using a photolithographic method, and then is formed through heat treatment at 200° C.

Next, using pattern films such as the organic insulating layer, the oxide semiconductor layer 34, the data signal line 45, the source electrode 35 and the drain electrode 36, which are located on the glass substrate 10, as an etching mask, the silicon oxide film on the lower layer side of the organic insulating layer and the insulating layer 61 made of a silicon oxide film and a silicon nitride film are etched, and the interlayer insulating layer 44 and the gate insulating layer 43 are formed. In etching at this time, dry etching in which, for example, carbon tetrachloride ($CF_4$) gas and oxygen ($O_2$) gas are appropriately combined is used. Thereafter, substrate cleaning such as water cleaning is performed as necessary.

The present invention is not limited by the film thickness and the configuration of the interlayer insulating layer 44, and the interlayer insulating layer 44 may be comprised including at least one material selected from a silicon nitride film ($SiN_x$), a silicon oxide film ($SiO_x$), aluminum oxide ($Al_2O_3$), tantalum pentoxide ($Ta_2O_5$), and titanium dioxide ($TiO_2$).

Pixel Electrode Layer Forming Step S104

The pixel electrode layer forming step S104 includes a step of depositing an ITO film, a step of forming a resist pattern film out of a photoresist material by using a photolithographic method, a step of performing wet etching on the ITO film (Indium tin oxide), and a step of removing the resist pattern film. Specifically, for example, the ITO film is deposited on the interlayer insulating layer 44 at a film thickness of approximately 100 nm by a sputtering method or the like in which argon (Ar) gas is used, and the deposited film is patterned in a required shape by using a photolithographic method, to thereby form the pixel electrode 31, the transparent electrode layer 52, the transparent electrode layer 54, and the connection electrode 56 which are shown in FIGS. 4 to 11. An oxalic acid (HOOC—COOH), a ferric chloride solution or the like can be used in etching the ITO film.

In this manner, it is possible to produce the active matrix substrate 1 of the present invention shown in FIGS. 4 to 11.

Meanwhile, in order to create the liquid crystal panel 4 by using the active matrix substrate 1, an alignment film for liquid crystal alignment may be further formed, and a liquid crystal alignment regulating structure may be formed, but a description thereof will be omitted herein.

The summary of the configuration of Embodiment 1 as follows. The gate metal layer (layer on which the scan signal line is formed) is formed of a Cu/Mo laminated film, and the source metal layer (layer on which the data signal line is formed) is formed of a Cu/Mo laminated film. The gate terminal is formed of the gate metal layer, and the source terminal is formed of the source metal layer.

(1) In the wet etching (etching of the gate metal layer) of the gate layer forming step S101 mentioned above, Cu/Mo is etched at one time by using an etchant containing hydrogen peroxide and an arbitrary acid, particularly, an etchant containing hydrogen peroxide and nitric acid.

(2) In the first wet etching (first etching step) of the semiconductor layer and source layer forming step S102, processing in portions other than the gap portion of the TFT is mainly performed. Here, a two-step wet etching method is used. As a first step thereof, the source metal layer 63 is etched by using an etchant containing hydrogen peroxide and nitric acid, and as a second step thereof, the oxide semiconductor layer 62 is etched by using an etchant containing oxalic acid (HOOC—COOH).

(3) In the second wet etching (second etching step) of the semiconductor layer and source layer forming step S102, processing in the gap portion of the TFT is mainly performed. Here, the primary processing layer 66 of the source metal layer is also etched by using an etchant containing hydrogen peroxide and nitric acid. In (1) to (3), the etchant containing hydrogen peroxide and nitric acid may be an etchant containing hydrogen peroxide and an arbitrary acid.

As seen from the above, in the present embodiment, when the source metal layer is formed of Cu/Mo, and the source metal layer 63 and the primary processing layer 66 of the source metal layer are etched by using the etchant containing hydrogen peroxide and an arbitrary acid, it is possible to perform etching with good controllability without giving etching damage to the oxide semiconductor layers 62 and 32.

Simultaneously, when the etchant containing oxalic acid (HOOC—COOH) is used in the etching of the oxide semiconductor layer using the oxide semiconductor layer (particularly, IGZO semiconductor layer) as the semiconductor layer of the TFT, it is possible to perform etching with good controllability without giving etching damage to the primary processing layer 66 of the source metal layer.

In the four-mask process in the related art, the dry etching of the semiconductor layer (amorphous silicon film and/or $n^+$ amorphous silicon film) is performed two times in a source and semiconductor layer forming step. There is a problem in that the dry etching of the amorphous silicon film and the $n^+$ amorphous silicon film has to be performed with precise control in order to obtain the selectivity to the gate insulating layer and the like as the lower layer, and a problem regarding an expensive apparatus and a throughput.

In Embodiment 1, the semiconductor layer is formed of IGZO, and the source metal layer and the semiconductor layer are wet-etched at one time, but the dry etching of the semiconductor layer as in the related art is not performed. The wet etching equipment is relatively inexpensive, and has a high throughput. Therefore, equipment investment costs are reduced, and thus an active matrix substrate can be efficiently produced.

In the asking removal of a resist of a halftone exposure portion in Embodiment 1, an inexpensive and high-throughput device such as an atmospheric pressure plasma device can be used in addition to the dry etching equipment including a vacuum chamber used in the formation of wiring lines or contact holes, and thus an active matrix substrate can be efficiently produced.

Meanwhile, in recent years, an active matrix substrate corresponding to higher-resolution and higher-speed driving has been required with a central focus of the application of a television receiver, and as materials of wiring lines and an electrode on the active matrix substrate, low electrical resistance materials such as aluminum or copper have been generally used.

Aluminum is known as one of the low electrical resistance materials similar to copper. However, when the source metal layer is formed containing aluminum, and processing is performed by using an etchant in the related art containing phosphoric acid, acetic acid and nitric acid, there is a problem in that since the etching rate of the oxide semiconductor layer in this etchant is considerably high, unnecessary overetching is given to the oxide semiconductor layer due to the penetration of the above-mentioned etchant or the contact of the etchant.

In the present invention, when the source metal layer is formed by using copper (or metal containing copper) and molybdenum (or metal containing molybdenum) rather than aluminum, and the etchant illustrated in the present embodiment is used, it is found that the source metal layer can be processed without giving unnecessary overetching to the oxide semiconductor layer. Further, by using this etchant, in the present invention, a process is found in which an active matrix substrate is efficiently produced by reducing equipment investment costs while using low electrical resistance materials.

Meanwhile, in the etchant containing hydrogen peroxide and nitric acid used in the present embodiment, since the etching rate of aluminum is considerably low, it is difficult to etch the aluminum practically, and thus the source metal layer is preferably formed particularly containing copper (or metal containing copper) as mentioned above.

Embodiment 2

In Embodiment 2, as the gate metal layer and the source metal layer, a Cu/Ti laminated film, that is, a gate metal layer and a source metal layer are used in which titanium (Ti) and copper (Cu) are deposited in order instead of the Cu/Mo laminated film, from the glass substrate 10 side.

Meanwhile, in the production of the active matrix substrate, since the material cost of titanium is cheaper than that of molybdenum, and titanium has a more excellent corrosion resistance under high humidity and high temperature than that of molybdenum, there is an advantage that the reliability of the terminal portion or the like of the active matrix substrate using titanium increases.

In the present embodiment, the gate layer forming step S101, and the deposition step S105, the first etching step S107 and the second etching step S109 in the semiconductor layer and source layer forming step S102 are different from those in Embodiment 1, and thus the descriptions thereof will be made sequentially.

Meanwhile, since other than these steps are the same as those in Embodiment 1, and the shapes (planar shapes and cross-sectional shapes), the arrangements and the production processes of the constructional members in the present embodiment are the same as those in Embodiment 1, the drawings of Embodiment 2 are common to those in Embodiment 1.

Gate Layer Forming Step S101

Similarly to the case of Embodiment 1, the state where the gate layer forming step S101 is completed is as shown in FIGS. 14 to 17.

In the present embodiment, titanium (Ti) and copper (Cu) are deposited in order on the transparent insulating substrate (glass substrate 18 in FIG. 3) such as glass and plastic through a sputtering method using argon (Ar) gas, and a gate metal layer (not shown) which is a Cu/Ti laminated film is formed. At this time, the film thickness of titanium is set to, for example, 10 nm, and the film thickness of copper is set to, for example, 300 nm. In the present embodiment, the temperature of the glass substrate 10 at the time of forming the gate metal layer is set to, for example, 100 to 200° C.

Next, in the etching of the gate metal layer, the gate metal layer is etched at one time by using an etchant containing hydrogen peroxide ($H_2O_2$), nitric acid ($HNO_3$) and hydrogen fluoride (HF). In addition, a process may be used which includes two steps of etching an upper layer made of copper by using the etchant containing hydrogen peroxide ($H_2O_2$) and nitric acid ($HNO_3$) illustrated in Embodiment 1 and etching a lower layer made of titanium by using hydrofluoric acid containing hydrogen fluoride (HF) of approximately 0.5 to 1 wt %. Others are the same as those in Embodiment 1.

Deposition Step S105

The source metal layer 63 is made of a Cu/Ti laminated film, and is formed by depositing titanium (Ti) and copper (Cu) in order similarly to the gate metal layer. At this time, the film thickness of titanium is set to, for example, 10 nm, and the film thickness of copper is set to, for example, 300 nm. In the present embodiment, the temperature of the glass substrate 10 at the time of forming the gate metal layer is set to, for example, 100 to 200° C. The steps of forming other insulating layer 61, oxide semiconductor layer 62 and the like are the same as those in Embodiment 1.

First Etching Step (Wet Etching) S107

Similarly to the case of Embodiment 1, the state where the first etching step S107 of the semiconductor layer and source layer forming step S102 is completed is as shown in FIGS. 22 to 25.

Here, from a state where the resist pattern film forming step S106 shown in FIGS. 18 to 21 is completed, the oxide semiconductor layer 62 and the source metal layer 63 are patterned by a two-step wet etching method using an alkaline etchant containing hydrogen peroxide, ammonia and citric acid and an etchant containing oxalic acid (HOOC—COOH).

More specifically, the alkaline etchant containing hydrogen peroxide, ammonia and citric acid may be an etchant composed of 4 wt % hydrogen peroxide ($H_2O_2$), 4 wt % ammonia ($NH_4$), 1 wt % citric acid ($C_6H_8O_7$), and balance water, and the etchant containing oxalic acid (HOOC—COOH) may be an etchant composed of 4 to 5 wt % oxalic acid (HOOC—COOH) and balance water. The solution temperature of these etchants may be set to, for example, 24° C. Here, the role of citric acid in the alkaline etchant containing hydrogen peroxide, ammonia and citric acid increases the etching rate of copper, and enables titanium and copper to be etched at one time. Thus, particularly, in this case, the citric acid is suitable.

Thereby, the oxide semiconductor layer 34 is formed from the oxide semiconductor layer 62, and the primary processing layer 66 of the source metal layer is formed from the source metal layer 63.

The two-step wet etching method will be described in more detail. In the first step, the source metal layer 63 is etched by using the alkaline etchant containing hydrogen peroxide, ammonia and citric acid, and in the second step, the oxide semiconductor layer 62 is etched by using the etchant containing oxalic acid (HOOC—COOH). The oxide semiconductor layer 62 is hardly etched by the alkaline etchant containing hydrogen peroxide, ammonia and citric acid. In the above-mentioned second step, the source metal layer 63 formed of a titanium layer and a copper layer is hardly etched by the etchant containing oxalic acid (HOOC—COOH). Therefore, it is possible to improve the production yield rate of the active matrix substrate without giving unnecessary etching damage to the primary processing layer 66 of the source metal layer in such two-step wet etching.

As in the related art, when an etchant containing fluoride such as hydrogen fluoride is used in etching the source metal layer 63 and the oxide semiconductor layer 62, the oxide semiconductor layer 62 and the source metal layer 63 can be etched at one time, but controllability is low in such an etching method. This is because when the etchant in the related art containing fluoride such as hydrogen fluoride is used, the etching rate of the oxide semiconductor layer 62 increases considerably further than that of the source metal layer and the oxide semiconductor layer 62 located below the resist pattern film 65 is considerably etched, and thus the primary processing layer 66 of the source metal layer tends to be removed. Therefore, it is difficult to produce the active matrix substrate.

Here, the primary processing layer 66 of the source metal layer is constituted by a lower layer 66a made of titanium and an upper layer 66b made of copper, and the pattern end (edge) of the lower layer 66a has a width larger than that of the upper layer 66b (forward lamination state). However, the pattern end (edge) of the lower layer 66a has a width larger than that of the oxide semiconductor layer 34 (backward lamination state). This is because overetching is performed in order to reliably perform the etching of the oxide semiconductor layer 62 which is the second step. Since the etching of the oxide semiconductor layer 62 is reliably performed, the shape of the pattern end in such a backward lamination state can make the production yield rate of the active matrix substrate improve.

Meanwhile, in the first etching step S107 of the present embodiment, the alkaline etchant containing hydrogen peroxide, ammonia and citric acid and the etchant containing oxalic acid (HOOC—COOH) are filled within separate etching baths, and the source metal layer 63 and the oxide semiconductor layer 62 are separately etched within each of the baths, which is preferable from the viewpoint of preventing the etchants from being mixed. Further, cleaning is performed by providing pure water cleaning equipment between the etching baths of the source metal layer 63 and that of the oxide semiconductor layer 62, which is more preferable from the viewpoint of preventing the etchants from being mixed.

Meanwhile, in the first etching step (wet etching) S107, the oxide semiconductor layer 62 and the source metal layer 63 may be patterned by a three-step wet etching method as another form. That is, from a state where the resist pattern film forming step S106 shown in FIGS. 18 to 21 is completed, the oxide semiconductor layer 62 and the source metal layer 63 may be patterned by the three-step wet etching method using the etchant containing hydrogen peroxide and nitric acid, the alkaline etchant containing hydrogen peroxide and ammonia, and the etchant containing oxalic acid (HOOC—COOH).

More specifically, similarly to Embodiment 1, the etchant containing hydrogen peroxide and nitric acid may be an etchant composed of 2 wt % hydrogen peroxide ($H_2O_2$), 1 wt % nitric acid ($HNO_3$), and balance water.

The alkaline etchant containing hydrogen peroxide and ammonia may be an etchant composed of 6 wt % hydrogen peroxide ($H_2O_2$), 3 wt % ammonia ($NH_4$), and balance water, and the etchant containing oxalic acid (HOOC—COOH) may be an etchant composed of 4 to 5 wt % oxalic acid (HOOC—COOH) and balance water. The solution temperature of theses etchants may be set to, for example, 24° C.

The three-step wet etching method will be described in more detail. In the first step, an upper layer 63b, made of copper, of the source metal layer 63 is etched by using the etchant containing hydrogen peroxide and nitric acid, in the second step, a lower layer 63a, made of titanium, of the source metal layer 63 is etched by using the etchant containing hydrogen peroxide and ammonia, and in the third step, the oxide semiconductor layer 62 is etched by using the etchant containing oxalic acid (HOOC—COOH). The oxide semiconductor layer 62 is hardly etched by the etchant containing hydrogen peroxide and nitric acid and the alkaline etchant containing hydrogen peroxide and ammonia. In the above-mentioned third step, the source metal layer 63 formed of a titanium layer and a copper layer is hardly etched by the etchant containing oxalic acid (HOOC—COOH). It is also possible to improve the production yield rate of the active matrix substrate without giving unnecessary etching damage to the primary processing layer 66 of the source metal layer in such three-step wet etching.

Meanwhile, here, the reason for the oxide semiconductor layer 62 not to be etched at the time of etching the upper layer 63b is because of the assumption that the coverage defect or the film surface abnormality of a pin hole or the like is present in a film constituting the lower layer 63a and the etchant penetrates up to the oxide semiconductor layer 62. In such a case, in the present embodiment, it is also possible to prevent a display defect, and to improve the production yield rate.

Second Etching Step S109

Similarly to Embodiment 1, the state where the second etching step S109 of the semiconductor layer and source layer forming step S102 is completed is as shown in FIGS. 30 to 33.

From a state where the asking step S108 shown in FIGS. 26 to 29 is completed, the primary processing layer 66 of the source metal layer is etched by a wet etching method using the alkaline etchant containing hydrogen peroxide, ammonia and citric acid, and the data signal line 45, the source electrode 35, the drain electrode 36, the drain lead-out line 37, the electrode 38, the source lead-out line 23, and the source terminal metal layer 53 are formed from the primary processing layer 66 of the source metal layer. Here, etching is performed under the conditions in which the etching selectivity of the source terminal metal layer 53 to the oxide semiconductor layer 34 is equal to or more than 2 so that the oxide semiconductor layer 34 made of an IGZO film is not etched, but the selectivity may be preferably equal to or more than 5. In the present embodiment, the alkaline etchant containing hydrogen peroxide, ammonia and citric acid is used for an etchant in this step, and the above-mentioned selectivity can be set to equal to or more than 5. When etching is performed with such a high selectivity, the oxide semiconductor layer 34 is hardly etched under the resist pattern film 67, and only the primary processing layer 66 of the source metal layer can be substantially subject to etching shift (side shift). In the present embodiment, as shown in the drawings, the pattern ends (edges) of the data signal line 45, the source electrode 35, the drain electrode 36 and the like are located further inside than the pattern end (edge) of the oxide semiconductor layer 34, and the oxide semiconductor layer 34 has a larger width. Therefore, the pattern end (edge) of the oxide semiconductor layer 34 does not move further inside than the pattern ends (edges) of the data signal line 45, the source electrode 35, the drain electrode 36 and the like, and disconnection or film separation does not occur in the data signal line 45, the source electrode 35, the drain electrode 36 and the like, thereby allowing the production yield rate to be improved. In addition, in the gap portion 41 of the TFT, since a decrease in the film thickness of the oxide semiconductor layer 34 is small, and the influence of the distribution rate in the plane of the substrate can be reduced, it is possible to stabilize the characteristics of the TFT in the plane of the substrate, to prevent a display defect, and to improve the production yield rate. At this time, angles (taper angles) in the pattern ends (edges) of the data signal line 45, the source electrode 35, the drain electrode 36 and the like are approximately the same as each other.

Meanwhile, the taper angles of the source electrode 35, the drain electrode 36 and the like in the gap portion 41 are approximately the same as the taper angles of the source electrode 35, the drain electrode 36 in places other than the gap portion 41. This is because the taper angles of the source electrode 35, the drain electrode 36 and the like in the gap portion 41 and places other than the gap portion 41 are determined in the second etching step S109, and in such a case, for example, the taper angles of the source electrode 35, the drain electrode 36 and the like in the gap portion 41 become considerably lower than those in the places other than the gap portion 41. Thus, since leakage failure is prevented between the source electrode 35 and the drain electrode 36, it is possible to improve the production yield rate of the active matrix substrate.

In addition, the source metal layer 63 of the present embodiment may be formed of a metal layer containing titanium and a metal layer containing copper from the glass substrate 10 side, and the first etching step S107 and the second etching step S109 can be implemented similarly.

Here, the metal containing titanium is a titanium-based metal and the titanium content may be equal to or more than 50 wt %, and the copper content of the metal containing copper may be equal to or more than 50 wt %. More preferably, the titanium content of the metal containing titanium may be equal to or more than 80 wt %, and the copper content of the metal containing copper may be equal to or more than 80 wt %. The metal containing titanium may be a titanium alloy containing titanium and one or more elements selected from nitrogen, oxygen, vanadium, niobium, neodymium, copper, tungsten, molybdenum, and tantalum, and the metal containing copper may be an alloy containing copper and one or more elements selected from nitrogen, oxygen, vanadium, niobium, neodymium, molybdenum, tungsten, titanium, and tantalum. Further, the metal layer containing titanium and the metal layer containing copper may have a laminated structure. When these layers are a metal layer containing titanium and a metal layer containing copper, respectively, as a whole, implementation can be made in the same way.

Meanwhile, in the second etching step S109, the primary processing layer 66 of the source metal layer may be etched by a two-step wet etching method as another form, and the data signal line 45, the source electrode 35, the drain electrode 36, the drain lead-out line 37, the electrode 38, the source lead-out line 23, and the source terminal metal layer 53 may be formed from the primary processing layer 66 of the source metal layer.

That is, from a state where the asking step S108 shown in FIGS. 26 to 29 is completed, the primary processing layer 66 of the source metal layer may be patterned by the two-step wet etching method using the etchant containing hydrogen peroxide and nitric acid and the alkaline etchant containing hydrogen peroxide and ammonia.

More specifically, similarly to Embodiment 1, the etchant containing hydrogen peroxide and nitric acid may be an etchant composed of 2 wt % hydrogen peroxide ($H_2O_2$), 1 wt % nitric acid ($HNO_3$), and balance water.

The alkaline etchant containing hydrogen peroxide and ammonia may be an etchant composed of 6 wt % hydrogen peroxide ($H_2O_2$), 3 wt % ammonia ($NH_4$), and balance water, and the solution temperature of these etchants may be set to, for example, 24° C.

The two-step wet etching method will be described in more detail. In the first step, the upper layer 66b, made of copper, of the primary processing layer 66 of the source metal layer is etched by using the etchant containing hydrogen peroxide and nitric acid, and in the second step, the lower layer 66a, made of titanium, of the primary processing layer 66 of the source metal layer is etched by using the etchant containing hydrogen peroxide and ammonia. The oxide semiconductor layer 62 is hardly etched by the etchant containing hydrogen peroxide and nitric acid and the alkaline etchant containing hydrogen peroxide and ammonia. In the gap portion 41 of the TFT, since a decrease in the film thickness of the oxide semiconductor layer 34 is small, and the influence of the distribution rate in the plane of the substrate can be reduced, it is possible to stabilize the characteristics of the TFT in the plane of the substrate, to prevent a display defect, and to improve the production yield rate.

Meanwhile, here, the reason for the oxide semiconductor layer 62 not to be etched at the time of etching the upper layer 66b is because of the assumption that the coverage defect or the film surface abnormality of a pin hole or the like is present in a film constituting the lower layer 66a and the etchant penetrates up to the oxide semiconductor layer 62. In such a case, in the present embodiment, it is also possible to prevent a display defect, and to improve the production yield rate.

Meanwhile, in Embodiment 2, the etchant containing hydrogen peroxide and nitric acid may be an etchant containing hydrogen peroxide and an arbitrary acid, and the etchant containing hydrogen peroxide, ammonia and citric acid may be an etchant containing hydrogen peroxide, ammonia and an arbitrary acid. Here, as these common arbitrary acids, inorganic acids such as sulfuric acid, persulfuric acid (peroxomonosulfuric acid), hydrochloric acid, phosphoric acid, and hydrobromic acid and organic acids such as citric acid, oxalic acid, and acetic acid can be used, and Embodiment 2 can be implemented in the same way.

In Embodiment 2, similarly to Embodiment 1, when the source metal layer is formed containing aluminum, and processing is performed by using an etchant in the related art containing phosphoric acid, acetic acid and nitric acid, there is a problem in that since the etching rate of the oxide semiconductor layer in this etchant is considerably high, unnecessary overetching is given to the oxide semiconductor layer due to the penetration of the above-mentioned etchant or the contact of the etchant.

As described in the present embodiment, in the present invention, when the source metal layer is formed by using copper (or metal containing copper) and titanium (or metal containing titanium) rather than aluminum, and the etchant illustrated in the present embodiment is used, it is found that the source metal layer can be processed without giving unnecessary overetching to the oxide semiconductor layer. Further, by using this etchant, in the present invention, a process is found in which an active matrix substrate is efficiently produced by reducing equipment investment costs while using low electrical resistance materials.

Meanwhile, in the etchant containing hydrogen peroxide and nitric acid, the alkaline etchant containing hydrogen peroxide and ammonia, and the alkaline etchant containing hydrogen peroxide, ammonia and citric acid which are used in the present embodiment, since the etching rate of aluminum is considerably low, it is difficult to etch the aluminum practically, and thus the source metal layer is preferably formed particularly containing copper (or metal containing copper) as mentioned above.

Meanwhile, in the present embodiment, the hydrogen ion exponents pH of the etchant containing hydrogen peroxide and ammonia and the etchant containing hydrogen peroxide, ammonia and citric acid are all ordinarily equal to or more than 9 (9 to 14).

Embodiment 3

Embodiment 3 relates to a process in which a different mask (resist pattern film) is used in a five-mask process, that is, each of five steps of a gate layer forming step, a semiconductor layer forming step, a source layer forming step, an interlayer insulating layer forming step, and a pixel electrode layer forming step. A gap portion etching step of the five-mask process is performed similarly to the second etching step in the embodiment of the four-mask process mentioned above.

In FIGS. 42 to 49, the active matrix substrate 1 of the present invention will be described in detail.

Here, the pixel 19 corresponds to an i-th scan signal line 46 (GLi) and a j-th data signal line 45 (SLj), is provided in the vicinity of an intersection point thereof, and is disposed so that an i-th holding capacitance wiring line 47 (CSLi) traverses the pixel 19. Here, i and j are arbitrary natural numbers equal to or less than m and n, respectively. The pixel 19 is a region for performing a display by changing the transmittance of backlight light by using the liquid crystal material 13, for example, in a transmissive liquid crystal display device.

Figure 42:
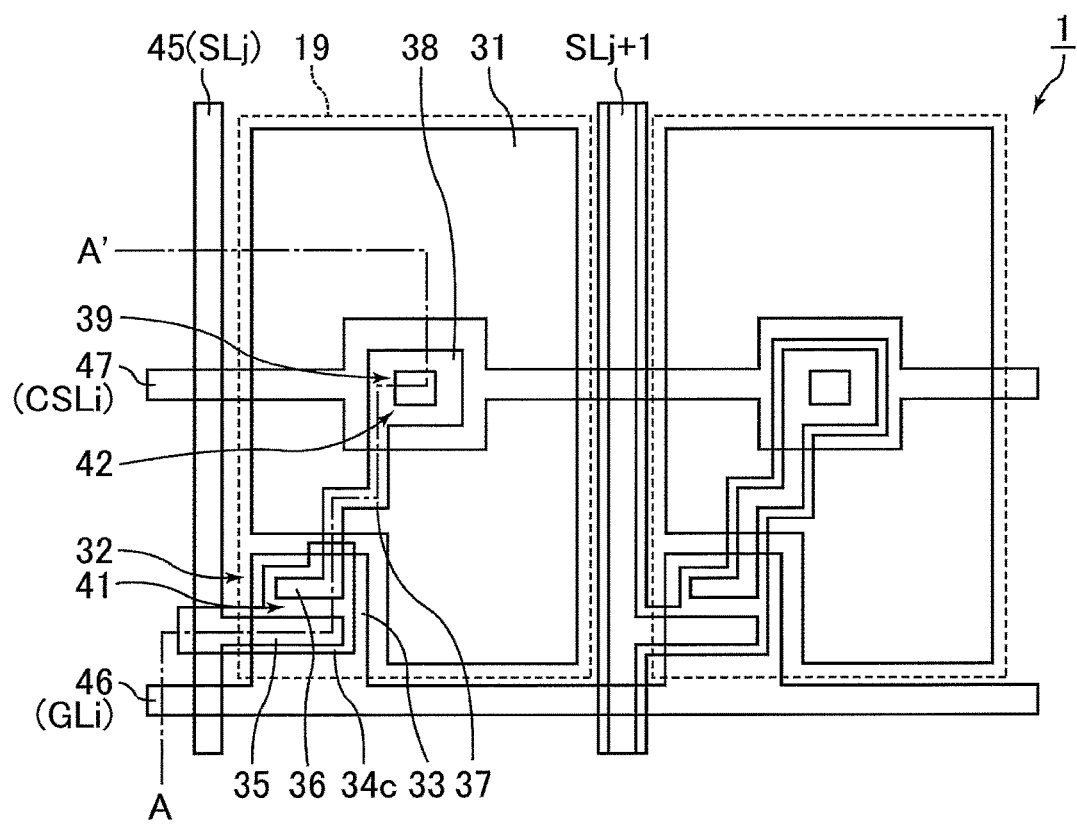
FIG. 42 is a diagram illustrating an active matrix substrate 1 of Embodiment 3, and is a plan view illustrating a configuration of a pixel 19 in a display region.
Figure 43:
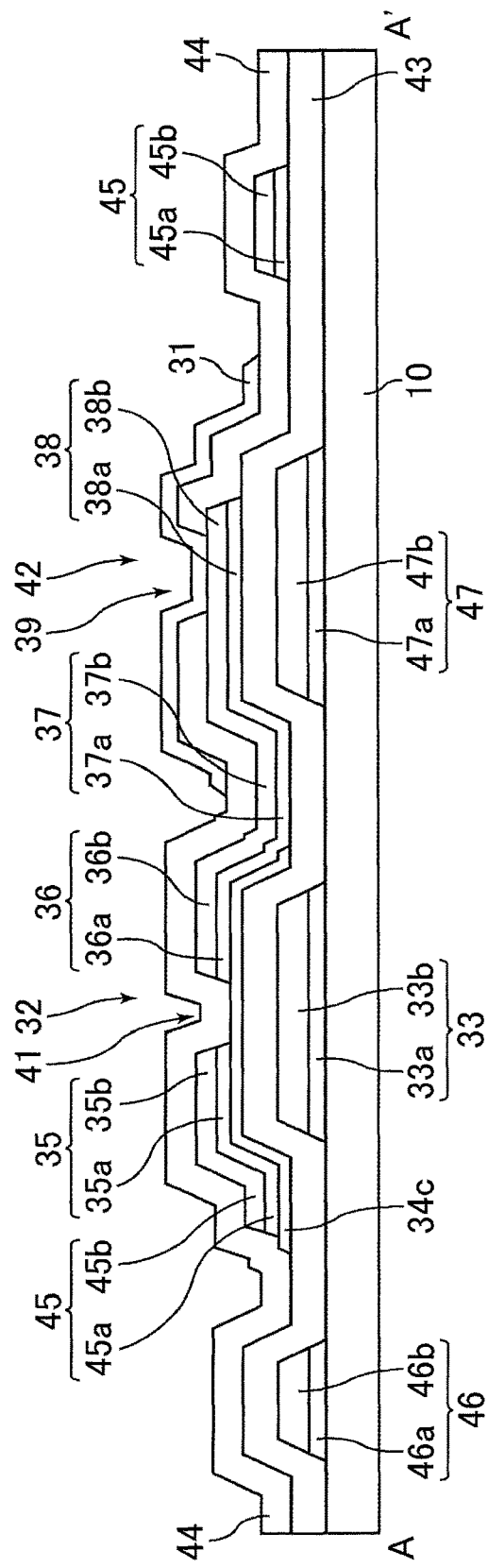
FIG. 43 is a diagram illustrating the active matrix substrate 1 of Embodiment 3, and is a cross-sectional view taken along line A-A' of FIG. 42.

FIGS. 42 and 43 are diagrams illustrating the active matrix substrate 1 of Embodiment 3, and FIG. 42 is a plan view illustrating a configuration of the pixel 19 in a display region. FIG. 43 is a cross-sectional view taken along line A-A' of FIG. 42. The pixel 19 has a pixel electrode 31 and a TFT 32. The TFT 32 has a gate electrode 33, a source electrode 35, and a drain electrode 36. Here, the gate electrode 33 is branched from the scan signal line 46 (GLi), and the source electrode 35 is branched from the data signal line 45 (SLj).

The drain electrode 36 is connected to a drain lead-out line (drain wiring line) 37, the drain lead-out line 37 is connected to an electrode 38, and the electrode 38 is connected to the pixel electrode 31 through a contact 39. An oxide semiconductor layer 34c is left in an island shape in a region centered on the TFT 32 as shown in the drawings, and is located on the lower layer side (glass substrate 10 side) of the data signal line 45, the source electrode 35, and the drain electrode 36, but the pattern edge of the oxide semiconductor layer 34c is located further on the outside than the pattern edges of the data signal line 45, the source electrode 35, and the drain electrode 36. That is, the oxide semiconductor layer 34c is larger in width than the data signal line 45, the source electrode 35, and the drain electrode 36. The gap portion 41 of the TFT 32 is a region located between the source electrode 35 and the drain electrode 36, and the oxide semiconductor layer 34c is left even in this region.

A holding capacitance forming portion 42 is constituted by both a portion in which the holding capacitance wiring line 47 overlaps the pixel electrode 31 with a gate insulating layer and an interlayer insulating layer 44 interposed therebetween and a portion in which the holding capacitance wiring line 47 overlaps the electrode 38 with the gate insulating layer 43 interposed therebetween. The capacitance formed herein is a holding capacitance, and contributes to the stability of a potential of the pixel electrode 31.

A more detailed description will be made with reference to FIG. 43. The scan signal line 46, the gate electrode 33, and the holding capacitance wiring line 47 are constituted by lower layers 46a, 33a, and 47a made of molybdenum, respectively, and upper layers 46b, 33b, and 47b made of copper, respectively, and are formed of the same gate metal layer as described later.

In addition, the data signal line 45, the source electrode 35, the drain electrode 36, the drain lead-out line 37, and the electrode 38 are constituted by lower layers 45a, 35a, 36a, 37a, and 38a made of molybdenum, respectively, and upper layers 45b, 35b, 36b, 37b, and 38b made of copper, respectively, and are formed of the same source metal layer.

FIGS. 44 to 49 are diagrams illustrating the active matrix substrate 1 of the present embodiment.

Figure 44:
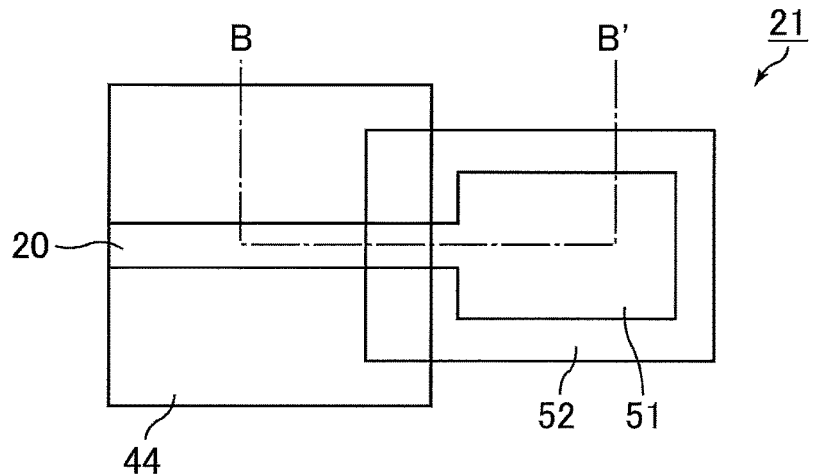
FIG. 44 is a schematic plan view illustrating a configuration of a gate terminal 21 of Embodiment 3.
Figure 45:
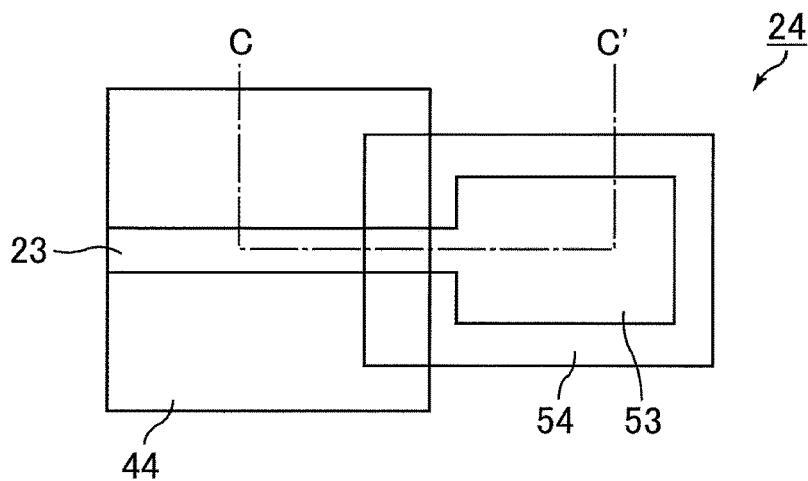
FIG. 45 is a schematic plan view illustrating a configuration of a source terminal 24 of Embodiment 3.
Figure 46:
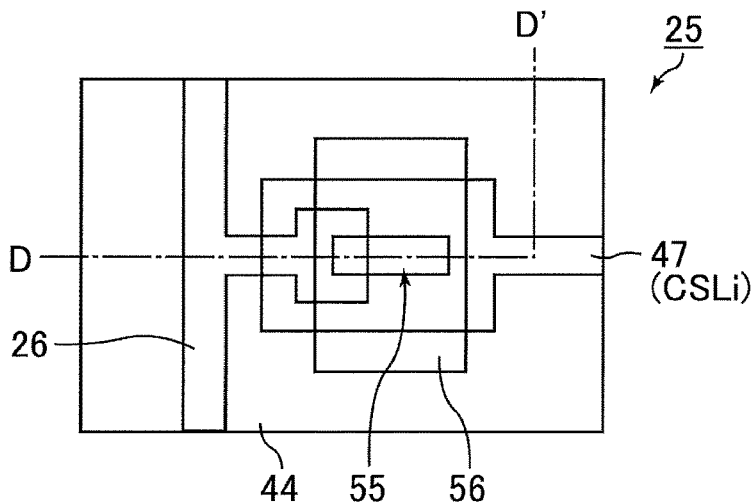
FIG. 46 is a schematic plan view illustrating a configuration of a contact 25 of Embodiment 3.

FIG. 44 is a schematic plan view illustrating a configuration of the gate terminal 21 in the present embodiment. FIG. 45 is a schematic plan view illustrating a configuration of the source terminal 24 in the present embodiment. FIG. 46 is a schematic plan view illustrating a configuration of the contact 25 in the present embodiment.

Figure 47:
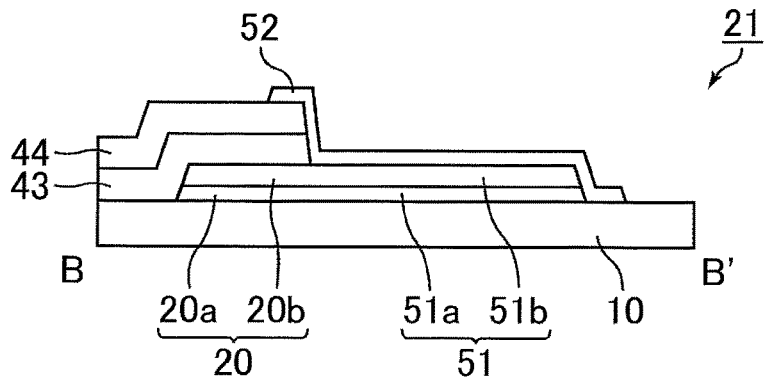
FIG. 47 is a schematic cross-sectional view taken along line B-B' of FIG. 44.
Figure 48:
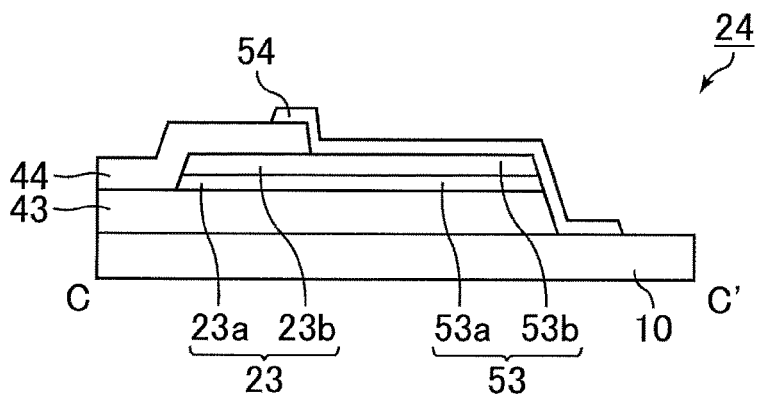
FIG. 48 is a schematic cross-sectional view taken along line C-C' of FIG. 45.
Figure 49:
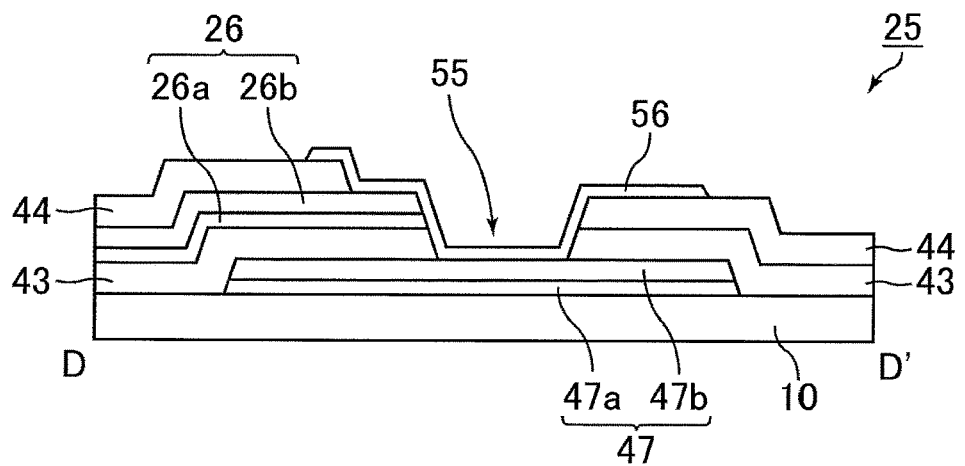
FIG. 49 is a schematic cross-sectional view taken along line D-D' of FIG. 46.

FIGS. 47, 48, and 49 are a schematic cross-sectional view taken along line B-B' of FIG. 44, a schematic cross-sectional view taken along line C-C' of FIG. 45, and a schematic cross-sectional view taken along line D-D' of FIG. 46, respectively.

Referring to FIG. 44 and FIG. 47 showing a section taken along line B-B' of FIG. 44, in the gate terminal 21, the gate lead-out line 20 is connected to a gate terminal metal layer 51, and the gate terminal metal layer 51 is connected to a transparent electrode layer 52 at a portion in which the gate insulating layer 43 and the interlayer insulating layer 44 are removed. Here, the transparent electrode layer 52 completely covers the gate terminal metal layer 51 including the pattern end thereof. The gate lead-out line 20 and the gate terminal metal layer 51 are constituted by lower layers 20a and 51a made of molybdenum, respectively, and upper layers 20b and 51b made of copper respectively, and are formed of the same gate metal layer as the scan signal line 46 or the like in FIGS. 42 and 43.

Referring to FIG. 45 and FIG. 48 showing a section taken along line C-C' of FIG. 45, in the source terminal 24, the source lead-out line 23 is connected to a source terminal metal layer 53, and the source terminal metal layer 53 is connected to a transparent electrode layer 54 at a portion in which the interlayer insulating layer 44 is removed. Here, the transparent electrode layer 54 completely covers the source terminal metal layer 53 including the pattern end thereof. The source lead-out line 23 and the source terminal metal layer 53 are constituted by lower layers 23a and 53a made of molybdenum, respectively, and upper layers 23b and 53b made of copper, respectively, and are formed of the same source metal layer as the data signal line 45 or the like in FIGS. 42 and 43.

Referring to FIG. 46 and FIG. 49 showing a section taken along line D-D' of FIG. 46, an aperture 55 is provided so as to overlap the holding capacitance wiring line 47 and the holding capacitance wiring trunk 26 and expose a portion thereof, and the holding capacitance wiring line 47 and the holding capacitance wiring trunk 26 are connected to each other via an upper-layer connection electrode 56.

The holding capacitance wiring trunk 26 is constituted by a lower layer 26a made of molybdenum and an upper layer 26b made of copper, and is formed of the same source metal layer as the data signal line 45 or the like in FIGS. 42 and 43.

Meanwhile, the holding capacitance wiring line terminal 28 has the same structure as that of the source terminal 24, and in FIGS. 45 and 48, the source lead-out line 23 may be replaced by the holding capacitance wiring trunk lead-out line 27. Thus, a detailed description thereof will be omitted.

Meanwhile, the configuration (the shape, the arrangement and the relation of connection of each member) of another pixel in the present embodiment is the same as that of the pixel 19 shown in FIGS. 42 to 43.

Process for Producing the Active Matrix Substrate 1

Figure 50:
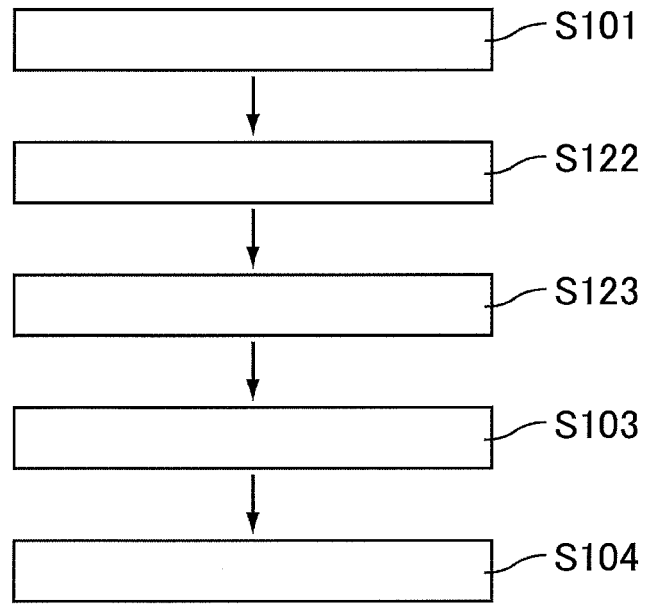
FIG. 50 is a process diagram illustrating steps of creating the active matrix substrate 1 of Embodiment 3.
Figure 51:
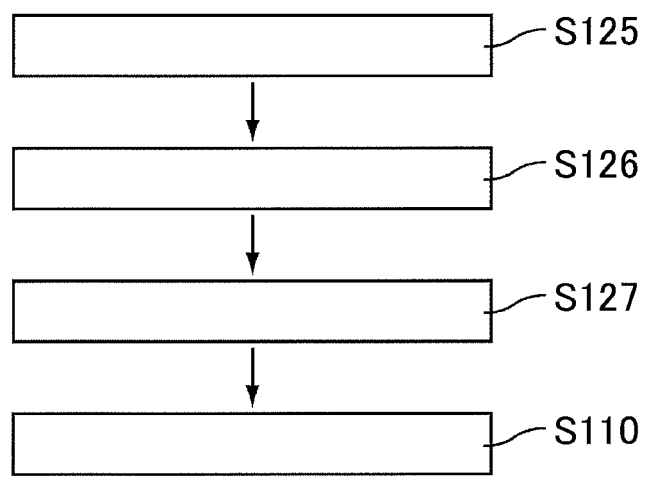
FIG. 51 is a process diagram specifically illustrating a source layer forming step S123 of Embodiment 3.

The active matrix substrate 1 of the present embodiment is created as process diagrams shown in FIGS. 50 and 51.

Meanwhile, the active matrix substrate will be described below, but the present invention can also be applied to another circuit board.

FIG. 50 is a process diagram illustrating steps of creating the active matrix substrate 1 of the present embodiment.

FIG. 51 is a process diagram specifically illustrating a source layer forming step S123 of the present embodiment.

Specific steps of producing the active matrix substrate 1 include an example (Embodiment 3) in which a circuit board of which the channel portion of a TFT is made of an oxide semiconductor (for example, IGZO), the scan signal line is made of a Cu/Mo laminated film, and the data signal line is made of a Cu/Mo laminated film is created by using a five-mask process, and are as follows. That is, the above-mentioned production steps are as shown in FIG. 50, and include a gate layer forming step S101, a semiconductor layer forming step S122, a source layer forming step S123, an interlayer insulating layer forming step S103, and a pixel electrode layer forming step S104, using a five-mask process.

In the present embodiment, the semiconductor layer forming step S122, and a resist pattern film forming step S126 and a gap portion etching step S127 of the source layer forming step S123 are different from those in Embodiment 1, and thus the descriptions thereof will be made sequentially.

Meanwhile, other than these steps (gate layer forming step S101, interlayer insulating layer forming step S103, and pixel electrode layer forming step S104) are the same as those in Embodiment 1, and a deposition step S125 and a resist removing step S130 of the source layer forming step S123 are the same as the deposition step S105 and the resist removing step S110 in Embodiment 1. Thus the descriptions thereof will be omitted. In addition, the plan view of the active matrix substrate 1 of Embodiment 3 is in common with the plan view of the active matrix substrate 1 of Embodiment 1 shown in FIG. 3.

Semiconductor Layer Forming Step S122

Figure 52:
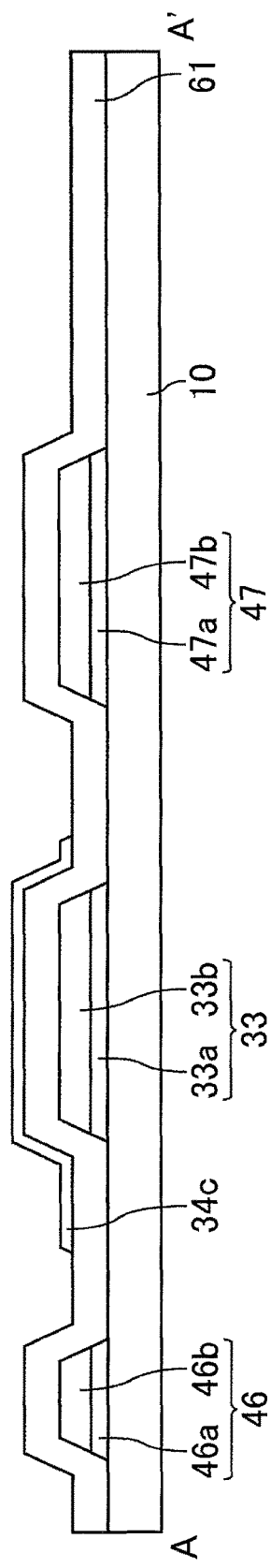
FIG. 52 is a cross-sectional view illustrating a section equivalent to line A-A' of FIG. 42 in a state where a semiconductor layer forming step S122 is completed.
Figure 53:
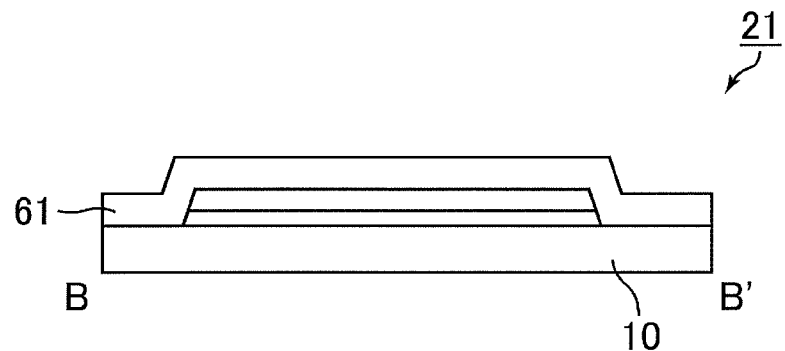
FIG. 53 is a cross-sectional view illustrating a section equivalent to line B-B' of FIG. 44 in a state where the semiconductor layer forming step S122 is completed.
Figure 54:
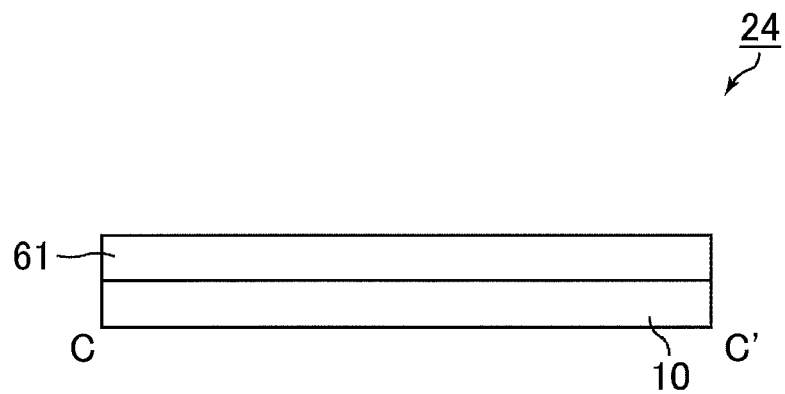
FIG. 54 is a cross-sectional view illustrating a section equivalent to line C-C' of FIG. 45 in a state where the semiconductor layer forming step S122 is completed.
Figure 55:
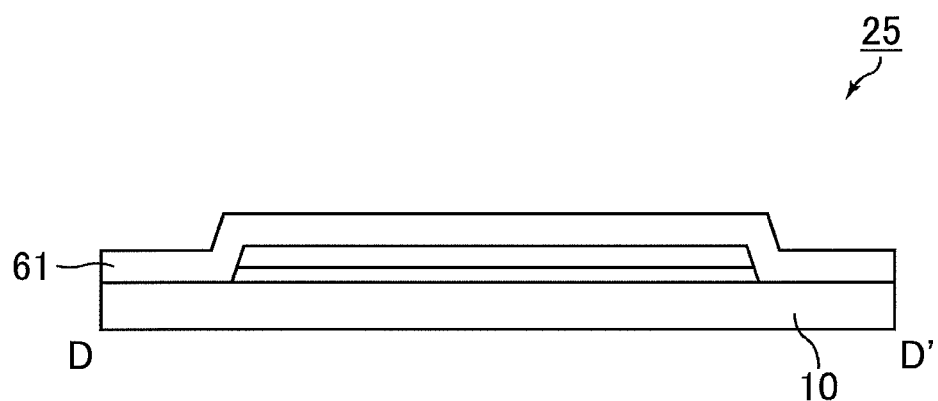
FIG. 55 is a cross-sectional view illustrating a section equivalent to line D-D' of FIG. 46 in a state where the semiconductor layer forming step S122 is completed.

FIGS. 52 to 55 show a state where the semiconductor layer forming step S122 using a mask for a semiconductor layer forming step is completed, and the oxide semiconductor layer (IGZO) 34c is formed on an insulating layer 61. FIG. 52 is a cross-sectional view illustrating a section equivalent to line A-A' of FIG. 42 in a state where the semiconductor layer forming step S122 is completed. FIG. 53 is a cross-sectional view illustrating a section equivalent to line B-B' of FIG. 44 in a state where the semiconductor layer forming step S122 is completed. FIG. 54 is a cross-sectional view illustrating a section equivalent to line C-C' of FIG. 45 in a state where the semiconductor layer forming step S122 is completed. FIG. 55 is a cross-sectional view illustrating a section equivalent to line D-D' of FIG. 46 in a state where the semiconductor layer forming step S122 is completed.

Meanwhile, the the insulating layer 61 is formed of a silicon nitride film ($SiN_x$) and a silicon oxide film ($SiO_x$) from the glass substrate 10 side. A plasma CVD method is used in depositing these films. As deposition gas, gas such as silane ($SiH_4$), ammonia ($NH_3$), hydrogen ($H_2$) and nitrogen ($N_2$) is used in the case of the silicon nitride film, and gas such as silane ($SiH_4$) and dinitrogen monoxide ($N_2O$) is used in the case of the silicon oxide film. The film thickness of the silicon nitride film is set to, for example, 325 nm, and the film thickness of the silicon oxide film is set to 50 nm.

The temperature of the glass substrate 10 at the time of the deposition thereof is set to, for example, 200 to 300° C.

However, the present invention is not limited by the film thickness and the configuration of the insulating layer 61. As another form, the insulating layer 61 may be configured so that only either of the silicon nitride film ($SiN_x$) and the silicon oxide film ($SiO_x$) is deposited, and may be configured to include aluminum oxide ($Al_2O_3$), tantalum pentoxide ($Ta_2O_5$), and titanium dioxide ($TiO_2$).

The oxide semiconductor layer 34c is obtained by processing the oxide semiconductor layer 62, deposited by a sputtering method in which argon (Ar) gas is used, by using a photolithographic method. At this time, the wet etching method similar to Embodiment 1 is used, and as a sputtering target, a sputtering target is used in which a mixture of indium oxide ($In_2O_3$), gallium oxide ($Ga_2O_3$), and zinc oxide (ZnO) is processed as a sintered compact. The ratio (atomic ratio) of indium:gallium:zinc contained in the obtained oxide semiconductor layer 34c is adjusted to be a composition ratio of 1:1:1. In the present embodiment, the temperature of the glass substrate 10 at the time of forming the oxide semiconductor layer 62 is set to, for example, 100 to 200° C.

However, the present invention is not limited to this range by the film thickness and the configuration of the oxide semiconductor layer 34c, but the ratio (atomic ratio) of indium:gallium:zinc can be applied similarly even when the ratio is different.

Source Layer Forming Step S123

As shown in FIG. 51, the source layer forming step S123 includes the deposition step S125, the resist pattern film forming step S126, the gap portion etching step S127, and the resist removing step S110. Here, the resist removing step S110 is the same as that in Embodiment 1, and thus the description thereof will be omitted.

Deposition Step S125

Here, a source metal layer (not shown) is formed similarly to the method illustrated in Embodiment 1. The source metal layer is formed of a Cu/Mo laminated film. The film thickness of molybdenum is set to, for example, 10 nm, and the film thickness of copper is set to, for example, 300 nm.

Resist Pattern Film Forming Step S126

In the resist pattern film forming step S126, a resist pattern film is formed on the source metal layer deposited in the deposition step S125 by using a photolithographic method. Here, unlike Embodiments 1 and 2, the portion (half resist portion) of which the resist pattern film thickness is smaller than those of others is not formed.

Gap Portion Etching Step S127

Figure 56:
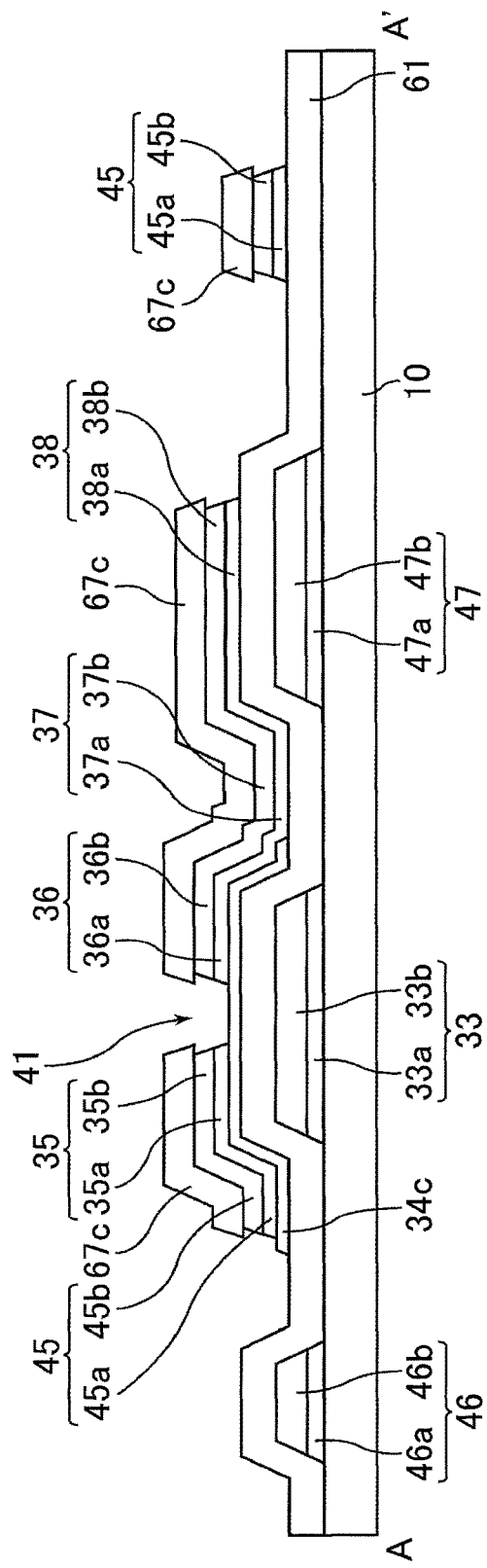
FIG. 56 is a cross-sectional view illustrating a section equivalent to line A-A' of FIG. 42 in a state where a gap portion etching step S127 is completed.
Figure 57:
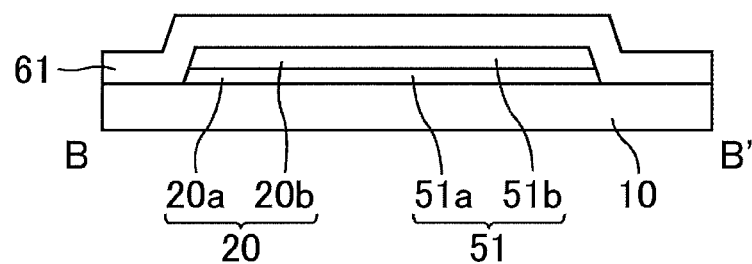
FIG. 57 is a cross-sectional view illustrating a section equivalent to line B-B' of FIG. 44 in a state where the gap portion etching step S127 is completed.
Figure 58:
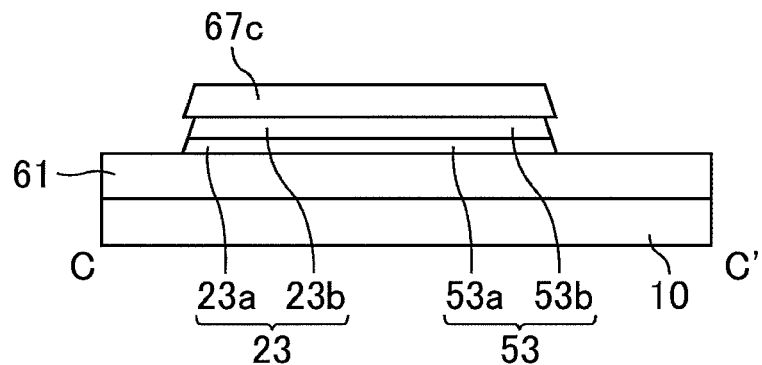
FIG. 58 is a cross-sectional view illustrating a section equivalent to line C-C' of FIG. 45 in a state where the gap portion etching step S127 is completed.
Figure 59:
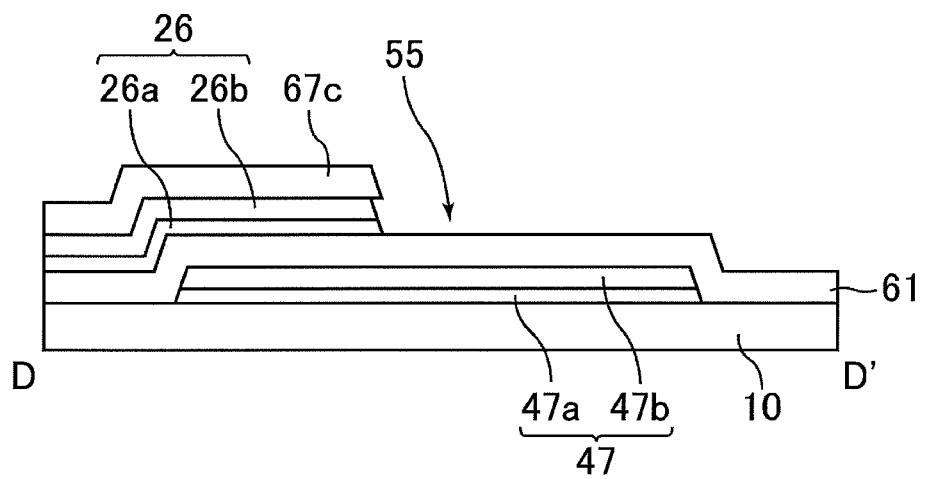
FIG. 59 is a cross-sectional view illustrating a section equivalent to line D-D' of FIG. 46 in a state where the gap portion etching step S127 is completed.

FIGS. 56 to 59 show a state where the gap portion etching step S127 of the source layer forming step S123 is completed. FIG. 56 is a cross-sectional view illustrating a section equivalent to line A-A' of FIG. 42 in a state where the gap portion etching step S127 is completed. FIG. 57 is a cross-sectional view illustrating a section equivalent to line B-B' of FIG. 44 in a state where the gap portion etching step S127 is completed. FIG. 58 is a cross-sectional view illustrating a section equivalent to line C-C' of FIG. 45 in a state where the gap portion etching step S127 is completed. FIG. 59 is a cross-sectional view illustrating a section equivalent to line D-D' of FIG. 46 in a state where the gap portion etching step S127 is completed.

In the gap portion etching step S127, the source metal layer formed in the deposition step S125 is patterned by wet etching using an etchant containing hydrogen peroxide and nitric acid. More specifically, the etchant containing hydrogen peroxide and nitric acid may be an etchant composed of 2 wt % hydrogen peroxide ($H_2O_2$), 1 wt % nitric acid ($HNO_3$), and balance water, and the solution temperature of the etchant may be set to, for example, 24° C. As mentioned above, the oxide semiconductor layer 34c in the gap portion is hardly etched by the etchant containing hydrogen peroxide and nitric acid.

Thereby, the data signal line 45, the source electrode 35, the drain electrode 36, the drain lead-out line 37, the electrode 38, the source lead-out line 23, and the source terminal metal layer 53 are formed from the source metal layer 63. At this time, the angles (taper angles) in the pattern ends (edges) of the data signal line 45, the source electrode 35, the drain electrode 36, the electrode 38, the source lead-out line 23, the source terminal metal layer 53 and the like are the same as each other.

Here, an arbitrary acid can be used instead of nitric acid. As this arbitrary acid, inorganic acids such as nitric acid, sulfuric acid, persulfuric acid (peroxomonosulfuric acid), hydrochloric acid, phosphoric acid, and hydrobromic acid and organic acids such as citric acid, oxalic acid, and acetic acid can be used, and implementation can be made in the same way.

In addition, the source metal layer of the present embodiment may be formed of a metal layer containing molybdenum and a metal layer containing copper from the glass substrate 10 side, and the gap portion etching step S127 can be implemented similarly.

Here, the metal containing molybdenum is a molybdenum-based metal and the molybdenum content may be equal to or more than 50 wt %, and the copper content of the metal containing copper may be equal to or more than 50 wt %. More preferably, the molybdenum content of the metal containing molybdenum may be equal to or more than 80 wt %, and the copper content of the metal containing copper may be equal to or more than 80 wt %. The metal containing molybdenum may be a molybdenum alloy containing molybdenum and one or more elements selected from nitrogen, oxygen, vanadium, niobium, neodymium, copper, tungsten, titanium, and tantalum, and the metal containing copper may be an alloy (copper alloy) containing copper and one or more elements selected from nitrogen, oxygen, vanadium, niobium, neodymium, molybdenum, tungsten, titanium, and tantalum. Further, the metal layer containing molybdenum and the metal layer containing copper may have a laminated structure. When these layers are a metal layer containing molybdenum and a metal layer containing copper, respectively, as a whole, implementation can be made in the same way.

In this manner, it is possible to produce the active matrix substrate 1 of the present invention shown in FIGS. 42 to 49.

Meanwhile, in order to create the liquid crystal panel 4 by using the active matrix substrate 1, an alignment film for liquid crystal alignment may be further formed, and a liquid crystal alignment regulating structure may be formed, but a description thereof will be omitted herein.

The summary of the configuration of Embodiment 3 is as follows. The gate metal layer (layer on which the scan signal line is formed) is formed of a Cu/Mo laminated film, and the source metal layer (layer on which the data signal line is formed) is formed of a Cu/Mo laminated film. The gate terminal is formed of the gate metal layer, and the source terminal is formed of the source metal layer.

(1) In the wet etching (etching of the gate metal layer) of the gate layer forming step S101 mentioned above, Cu/Mo is etched at one time by using an etchant containing hydrogen peroxide and an arbitrary acid, particularly, an etchant containing hydrogen peroxide and nitric acid.

(2) In the gap portion etching step S127 of the source layer forming step S123, processing in the gap portion of the TFT and portions other than the gap portion are performed. The source metal layer is etched by using the etchant containing hydrogen peroxide and nitric acid.

In (1) to (2), the etchant containing hydrogen peroxide and nitric acid may be an etchant containing hydrogen peroxide and an arbitrary acid.

As seen from the above, in the present embodiment, when the source metal layer is formed of Cu/Mo, and the source metal layer is etched by using the etchant containing hydrogen peroxide and arbitrary acid, it is possible to perform etching with good controllability without giving etching damage to the oxide semiconductor layer 34c.

In the five-mask process in the related art, the semiconductor layer (amorphous silicon film and/or $n^+$ amorphous silicon film) is etched by dry etching in both the semiconductor layer forming step and the source layer forming step. There is a problem in that the dry etching of the amorphous silicon film and the $n^+$ amorphous silicon film has to be performed with precise control in order to obtain the selectivity to the gate insulating layer and the like as the lower layer, and a problem regarding an expensive apparatus and a throughput.

In Embodiment 3, the semiconductor layer is formed of IGZO, and both the semiconductor layer and the source metal layer are etched by wet etching, but the dry etching of the semiconductor layer as in the related art is not performed. The wet etching equipment is relatively inexpensive, and has a high throughput. Therefore, equipment investment costs are reduced, and thus the efficient active matrix substrate can be produced.

In Embodiment 3, when the source metal layer is formed of Cu/Ti, the source metal layer is etched by using the method illustrated in the second etching step S102 in Embodiment 2, thereby allowing the active matrix substrate to be created. Even in this case, since both the semiconductor layer and the source metal layer are etched by wet etching, equipment investment costs are reduced, and thus the active matrix substrate can be efficiently produced.

In Embodiment 3, similarly to Embodiments 1 and 2, the source metal layer is formed by using copper (or metal containing copper) rather than aluminum, thereby allowing the active matrix substrate to be efficiently produced by reducing equipment investment costs while using low electrical resistance materials.

Hereinafter, Embodiments 1 to 3 will be supplemented. In Embodiments 1 to 3, an example is illustrated in which the IGZO semiconductor which is a metal oxide semiconductor is used as an oxide semiconductor layer. However, as the oxide semiconductor layer of the present invention, a Zn—O based semiconductor (ZnO semiconductor) which is a zinc oxide, a Ti—O based semiconductor ($TiO_2$ semiconductor) which is a titanium oxide, a Zn—Ti—O based semiconductor (ZTO semiconductor) which is a zinc titanium composite oxide, and the like can be used similarly as a single layer or a laminated layer made of a different semiconductor. Particularly, the IGZO semiconductor and the ZTO semiconductor are preferably in an amorphous state.

Meanwhile, in Embodiments 1 to 3, only wet etching is used in etching the source metal layer or the oxide semiconductor layer, but as another form of the present invention, dry etching may be supplementarily used in etching a portion of a film or a layer constituting the source metal layer or the oxide semiconductor layer. Even in this case, it is possible to reduce the use of the dry etching equipment, to reduce equipment investment costs, and to efficiently produce the active matrix substrate.

Configuration Example of Television Receiver

Figure 60:
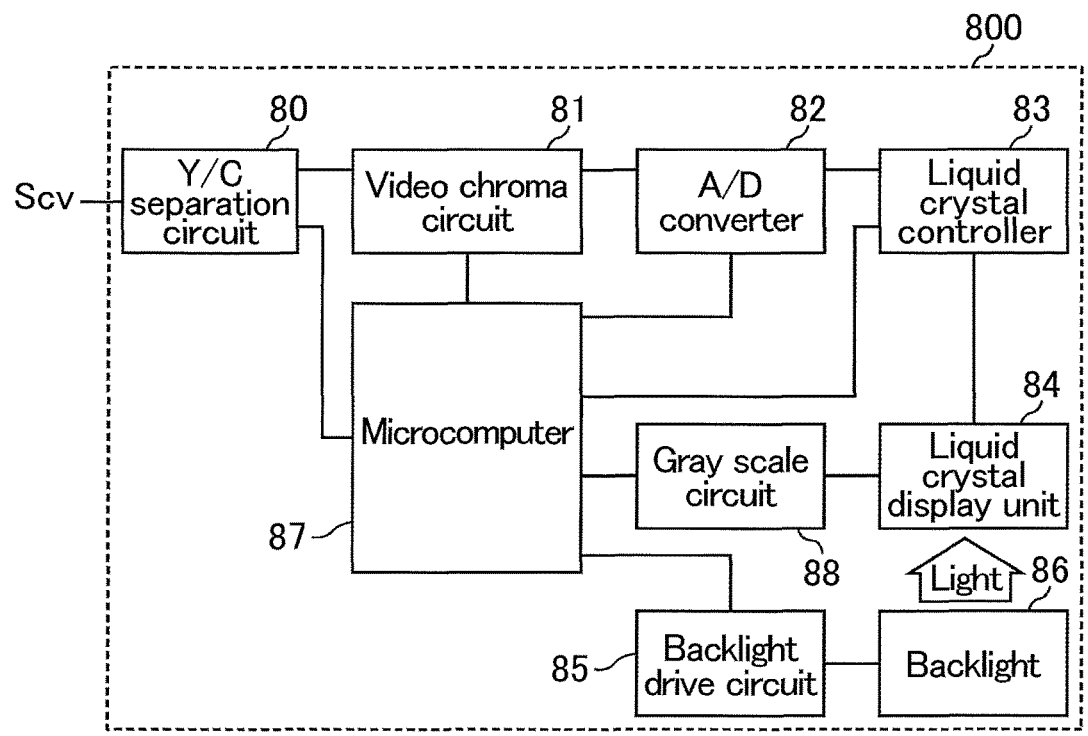
FIG. 60 is a block diagram illustrating a configuration of a liquid crystal display device 800 for a television receiver.

Finally, a configuration example of a television receiver of the present embodiment will be described. Hereinafter, a description will be made of a configuration example when the above-mentioned liquid crystal display device 1000 or the like of the present embodiment is applied to the television receiver. In addition, here, the above-mentioned liquid crystal display device 1000 or the like of the present embodiment is indicated as a liquid crystal display device 800. Meanwhile, in the present specification, the television receiver or the like is also one of the liquid crystal display devices. FIG. 60 is a block diagram illustrating a configuration of the liquid crystal display device 800 for a television receiver. The liquid crystal display device 800 includes a liquid crystal display unit 84, a Y/C separation circuit 80, a video chroma circuit 81, an A/D converter 82, a liquid crystal controller 83, a backlight drive circuit 85, a backlight 86, a microcomputer 87, and a gray scale circuit 88. Meanwhile, the liquid crystal display unit 84 is constituted by a liquid crystal panel, and a source driver and a gate driver for driving the panel.

In the liquid crystal display device 800 having the above-mentioned, first, a composite color video signal Scv used as a television signal is input to the Y/C separation circuit 80 from the outside, and thus is separated into a luminance signal and a color signal. The luminance signal and the color signal are converted into an analog RGB signal corresponding to three primary colors of light by the video chroma circuit 81, and the analog RGB signal is further converted into a digital RGB signal by the A/D converter 82. This digital RGB signal is input to the liquid crystal controller 83. In addition, in the Y/C separation circuit 80, horizontal and vertical synchronizing signals are also extracted from the composite color video signal Scv which is input from the outside, and these synchronizing signals are also input to the liquid crystal controller 83 through the microcomputer 87.

The digital RGB signal is input to the liquid crystal display unit 84 from the liquid crystal controller 83 at a predetermined timing together with a timing signal based on the above-mentioned synchronizing signals. In addition, in the gray scale circuit 88, a gray scale potential of each of three primary colors R, G, and B for a color display is generated, and the gray scale potential is also supplied to the liquid crystal display unit 84. In the liquid crystal display unit 84, driving signals (data signal=signal potential, scan signal and the like) are generated by the internal source driver, gate driver and the like on the basis of the RGB signal, the timing signal and the gray scale potential, and a color image is displayed on the internal liquid crystal panel on the basis of the driving signals. Meanwhile, in order to display an image through the liquid crystal display unit 84, light irradiation is required to be performed from the rear the liquid crystal panel within the liquid crystal display unit. In the liquid crystal display device 800, the backlight drive circuit 85 drives the backlight 86 under the control of the microcomputer 87, so that the back surface of the liquid crystal panel is irradiated with light. The microcomputer 87 controls the entire system including the above-mentioned processes. Meanwhile, as a video signal (composite color video signal) which is input from the outside, not only a video signal based on television broadcasting, but also a video signal imaged by a camera or a video signal supplied through the Internet connection can be used. In the liquid crystal display device 800, image display based on various video signals can be performed.

Figure 61:
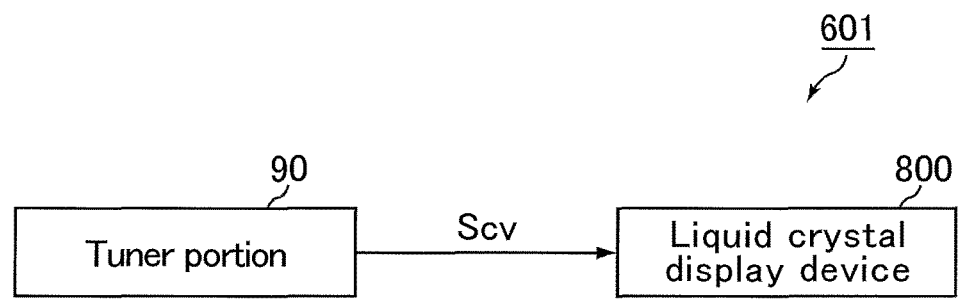
FIG. 61 is a block diagram illustrating a configuration of a television receiver 601 of the present embodiment in which a tuner portion 90 is connected to the liquid crystal display device 800.

When an image based on television broadcasting is displayed by the liquid crystal display device 800, a tuner portion 90 is connected to the liquid crystal display device 800 as shown in FIG. 61, to thereby comprise a television receiver 601. The tuner portion 90 extracts a channel signal to be received from waves (high frequency signals) received in an antenna (not shown) to convert the channel signal into an intermediate frequency signal, and extracts the composite color video signal Scv used as a television signal by detecting the intermediate frequency signal. This composite color video signal Scv is input to the liquid crystal display device 800 as mentioned above, and an image based on the composite color video signal Scv is displayed by the liquid crystal display device 800.

Figure 62:
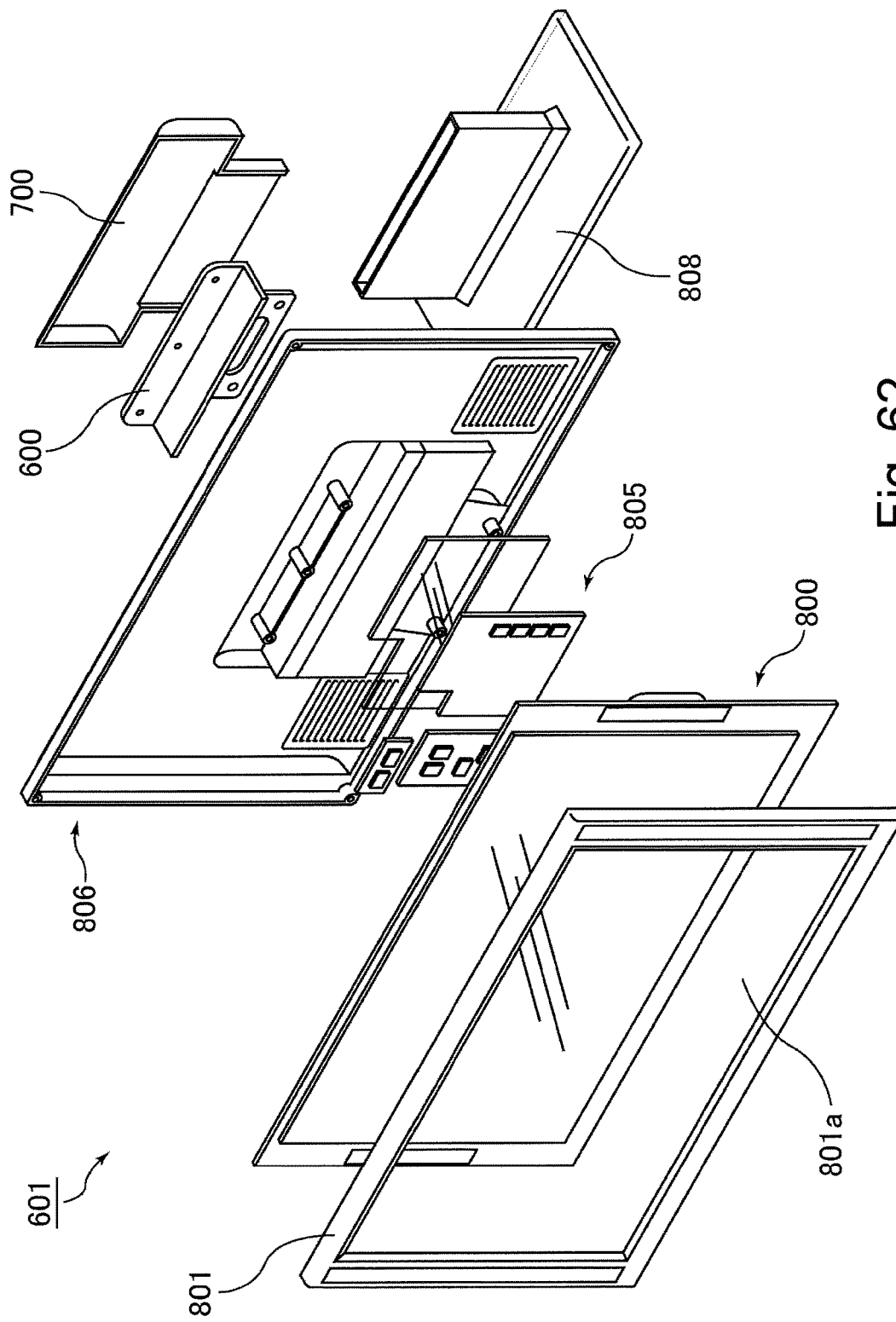
FIG. 62 is an exploded perspective view illustrating a configuration example of the television receiver of the present embodiment.

FIG. 62 is an exploded perspective view illustrating a configuration example of the television receiver of the present embodiment. As shown in the same drawing, the television receiver 601 includes a first housing 801 and a second housing 806 as components thereof in addition to the liquid crystal display device 800, and wraps around the liquid crystal display device 800 so as to be interposed between the first housing 801 and the second housing 806. An aperture 801*a* transmitting an image displayed by the liquid crystal display device 800 is formed in the first housing 801. In addition, the second housing 806 covers the back surface of the liquid crystal display device 800, and is configured to be provided with an operating circuit 805 for operating the liquid crystal display device 800, and fitted with a supporting member 808 on the lower side through a metal fitting 600 and a unit 700.

The present invention is not limited to the above-mentioned embodiments, but appropriate modifications of the above-mentioned embodiments based on general technical knowledge or those obtained by a combination thereof are also included the embodiments of the present invention.

The aforementioned modes of the embodiments may be employed inappropriate combination as long as the combination is not beyond the spirit of the present invention.

The present application claims priority to Patent Application No. 2010-161077 filed in Japan on Jul. 15, 2010 under the Paris Convention and provisions of national law in a designated State, the entire contents of which are hereby incorporated by reference.

REFERENCE SIGNS LIST

1000: liquid crystal display device
1: active matrix substrate
2: sealing material
3: counter substrate (color filter substrate)
4: liquid crystal panel
5: gate driver
6: source driver
7, 8: polyimide film
9: external substrate
10, 18: glass substrate
11: gate terminal portion
12: source terminal portion
13: liquid crystal material
15: display region
16: peripheral region
17: sealing line
19: pixel
20: gate lead-out line
21: gate terminal
22: contact
23: source lead-out line
24: source terminal
25, 39: contact
26: holding capacitance wiring trunk
27: holding capacitance wiring trunk lead-out line
28: holding capacitance wiring line terminal
31: pixel electrode
32: TFT
33: gate electrode
34, 34*c*: oxide semiconductor layer
35: source electrode
36: drain electrode
37: drain lead-out line
38: electrode
41: gap portion
42: holding capacitance forming portion
43: gate insulating layer
44: interlayer insulating layer
45: data signal line
45*a*: lower layer
45*b*: upper layer
46: scan signal line
46*a*: lower layer
46*b*: upper layer
47: holding capacitance wiring line
47*a*: lower layer
47*b*: upper layer
51: gate terminal metal layer
51*a*: lower layer
51*b*: upper layer
52: transparent electrode layer
53: source terminal metal layer
54: transparent electrode layer
55, 75: aperture
56: connection electrode
61: insulating layer
62: oxide semiconductor layer
63: source metal layer
65: resist pattern film
66: primary processing layer of the source metal layer
67: resist pattern film
76: connection electrode
S101: gate layer forming step
S102: semiconductor layer and source layer forming step
S103: interlayer insulating layer forming step
S104: pixel electrode layer forming step
S105: deposition step
S106: resist pattern film forming step
S107: first etching step
S108: asking step
S109: second etching step
S110: resist removing step
S122: semiconductor layer forming step
S123: source layer forming step
S125: deposition step
S126: resist pattern film forming step
S127: gap portion etching step
600: metal fitting
601: television receiver 700: unit
800: liquid crystal display device
801: first housing
801a: aperture
805: operating circuit
806: second housing
808: supporting member
GL1 to GLm: scan signal line
SL1 to SLn: data signal line
CSL1 to CSLm: holding capacitance wiring line
Scv: color video signal

The invention claimed is:

1. A process for producing a circuit board including an oxide semiconductor layer and an electrode connected to the oxide semiconductor layer, the process comprising:
 a semiconductor layer forming step of forming an oxide semiconductor layer;
 an electric conductor layer forming step of forming an electric conductor layer by laminating a layer made of a metal other than copper and a layer containing copper; and
 a processing step of processing the electric conductor layer by using wet etching, wherein the processing step includes forming the electrode,
 the processing step includes a first etching step of etching the electric conductor layer and the oxide semiconductor layer and a second etching step of etching the electric conductor layer by using wet etching, and
 the first etching step includes etching the electric conductor layer and the oxide semiconductor layer such that a pattern end of the bottom layer of the electric conductor layer in contact with the oxide semiconductor layer has a larger width than a pattern end of the oxide semiconductor layer.

2. The process for producing a circuit board according to claim 1, wherein the second etching step separates the electric conductor layer into a source electrode and a drain electrode, and causes a portion of the source electrode which is connected to the semiconductor layer and a portion of the drain electrode which is connected to the semiconductor layer to face each other with a gap interposed therebetween.

3. The process for producing a circuit board according to claim 1, wherein in the first etching step and/or the second etching step, the layer containing copper is etched by using an etchant containing hydrogen peroxide and an acid.

4. The process for producing a circuit board according to claim 1, wherein the layer made of a metal other than copper is a layer made of a metal containing molybdenum, and in the first etching step and/or the second etching step, the layer made of a metal containing molybdenum is etched by using an etchant containing hydrogen peroxide and an acid.

5. The process for producing a circuit board according to claim 1, wherein in the first etching step and/or the second etching step, the layer containing copper is etched by using an alkaline etchant.

6. The process for producing a circuit board according to claim 1, wherein the layer made of a metal other than copper is a layer made of a metal containing titanium, and in the first etching step and/or the second etching step, the layer made of a metal containing titanium is etched by using an alkaline etchant.

7. The process for producing a circuit board according to claim 5, wherein the alkaline etchant is an etchant containing hydrogen peroxide and ammonia.

8. The process for producing a circuit board according to claim 5, wherein the alkaline etchant is an etchant containing hydrogen peroxide, ammonia and an acid.

9. The process for producing a circuit board according to claim 1, wherein in the first etching step, the oxide semiconductor layer is etched by using an etchant containing oxalic acid.

10. The process for producing a circuit board according to claim 1, wherein the oxide semiconductor layer is formed of indium gallium zinc composite oxide.

11. The process for producing a circuit board according to claim 1, wherein the second etching step includes etching the electric conductor layer by using wet etching such that the pattern end of the oxide semiconductor layer has a larger width than a pattern end of the electric conductor layer.

* * * * *